United States Patent
Shiono et al.

(10) Patent No.: US 10,809,428 B2
(45) Date of Patent: Oct. 20, 2020

(54) OPTICAL FILTER AND IMAGING DEVICE

(71) Applicant: AGC Inc., Chiyoda-ku (JP)

(72) Inventors: Kazuhiko Shiono, Koriyama (JP);
Keigo Matsuura, Koriyama (JP);
Sayuri Higashitamori, Koriyama (JP);
Hiroki Hotaka, Koriyama (JP)

(73) Assignee: AGC Inc., Chiyoda-ku (JP)

( * ) Notice: Subject to any disclaimer, the term of this patent is extended or adjusted under 35 U.S.C. 154(b) by 394 days.

(21) Appl. No.: 15/806,596

(22) Filed: Nov. 8, 2017

(65) Prior Publication Data
US 2018/0067243 A1 Mar. 8, 2018

Related U.S. Application Data

(63) Continuation of application No. PCT/JP2016/063977, filed on May 11, 2016.

(30) Foreign Application Priority Data

May 12, 2015 (JP) .................. 2015-097777

(51) Int. Cl.
| | |
|---|---|
| G02B 5/20 | (2006.01) |
| G02B 5/22 | (2006.01) |
| C09B 57/00 | (2006.01) |
| G01J 1/04 | (2006.01) |
| G02B 1/04 | (2006.01) |
| H01L 27/146 | (2006.01) |

(52) U.S. Cl.
CPC ............ *G02B 5/208* (2013.01); *C09B 57/007* (2013.01); *G01J 1/0488* (2013.01); *G02B 1/04* (2013.01); *G02B 5/22* (2013.01); *H01L 27/14625* (2013.01)

(58) Field of Classification Search
CPC .......... G02B 5/208; G02B 5/22; G02B 5/223; G02B 1/04; C09B 57/007; G01J 1/0488; H01L 27/14625
See application file for complete search history.

(56) References Cited

U.S. PATENT DOCUMENTS 5,543,086 A 8/1996 Bertelson et al.
10,082,611 B2 * 9/2018 Shiono .................. C09B 57/007
(Continued)

FOREIGN PATENT DOCUMENTS

| CN | 104755969 | 7/2015 |
|---|---|---|
| CN | 104838294 | 8/2015 |

(Continued)

OTHER PUBLICATIONS

Steffen et al., DE 10109243, English Language Machine Translation (Year: 2002).*
(Continued)

*Primary Examiner* — Stephone B Allen
*Assistant Examiner* — Adam W Booher
(74) *Attorney, Agent, or Firm* — Oblon, McClelland, Maier & Neustadt, L.L.P.

(57) ABSTRACT

An optical filter includes an absorption layer which increases a visible light transmittance while having a good near-infrared blocking characteristic, and which is excellent in not only adhesiveness with respect to a layer to be abutted, but also light resistance. The optical filter includes: an absorption layer containing a near-infrared absorbing dye containing a squarylium-based dye and a transparent resin; and an inorganic or organic material in contact with the absorption layer. The squarylium-based dye has a squarylium skeleton and condensed ring structures bonded thereto respectively on both sides thereof, the condensed ring structures each including a benzene ring and a nitrogen atom as an annular atom, each benzene ring having an urethane structure in the second position.

18 Claims, 2 Drawing Sheets

(56) References Cited

U.S. PATENT DOCUMENTS

| | | | |
|---|---|---|---|
| 10,495,796 B2* | 12/2019 | Shiono | G02B 1/04 |
| 2012/0197026 A1 | 8/2012 | Maeda et al. | |
| 2014/0055652 A1* | 2/2014 | Hasegawa | G02B 5/281 |
| | | | 348/294 |
| 2014/0061505 A1 | 3/2014 | Steppel et al. | |
| 2014/0264202 A1 | 9/2014 | Nagaya et al. | |
| 2015/0146057 A1 | 5/2015 | Konishi et al. | |
| 2015/0260889 A1 | 9/2015 | Shiono et al. | |
| 2017/0003417 A1 | 1/2017 | Nagaya et al. | |
| 2017/0003425 A1 | 1/2017 | Nagaya et al. | |

FOREIGN PATENT DOCUMENTS

| | | |
|---|---|---|
| DE | 100 57 141 A1 | 5/2002 |
| DE | 101 09 243 A1 | 9/2002 |
| JP | 1-228960 | 9/1989 |
| JP | 2013-19991 | 1/2013 |
| JP | 2014-59550 | 4/2014 |
| JP | 2014-66918 | 4/2014 |
| JP | 2014-148567 | 8/2014 |
| KR | 10-2015-0046016 | 4/2015 |
| KR | 10-2015-0094631 | 8/2015 |
| WO | WO 2011/086785 A1 | 7/2011 |
| WO | WO 2013/054864 A1 | 4/2013 |
| WO | WO 2014/030628 A1 | 2/2014 |
| WO | WO 2014/088063 A1 | 6/2014 |

OTHER PUBLICATIONS

International Search Report dated Aug. 9, 2016 in PCT/JP2016/063977, filed on May 11, 2016 (with English Translation).
Written Opinion dated Aug. 9, 2016 in PCT/JP2016/063977, filed on May 11, 2016.

* cited by examiner

OPTICAL FILTER AND IMAGING DEVICE

CROSS-REFERENCE TO RELATED APPLICATIONS

The present application is a continuation of prior International Application No. PCT/JP2016/063977 filed on May 11, 2016 which is based upon and claims the benefit of priority from Japanese Patent Application No. 2015-097777 filed on May 12, 2015; the entire contents of all of which are incorporated herein by reference.

FIELD

The present invention relates to an optical filter which transmits visible light and cuts off near-infrared light, and an imaging device provided with the optical filter.

BACKGROUND

In an imaging device using a solid-state image sensing element such as a CCD which is mounted on a digital still camera or the like, an optical filter (near-infrared cut filter) which transmits visible light and blocks near-infrared light has been used, in order to favorably reproduce a color tone and obtain a clear image.

An optical filter using a dye having high absorbency particularly in a near-infrared region and having a high transmitting property in a visible region has been in heavy usage since it is possible to obtain a steep cutoff property with respect to the near-infrared ray and obtain good color reproducibility of an image by visible light.

Such a near-infrared cut filter uses a resin layer (resin substrate) obtained by making a dye having a light absorption function to be dissolved or dispersed in a transparent resin. Further, for the purpose of increasing strength and the like, such a resin layer is stacked on a transparent substrate made of an inorganic material such as a glass in the near-infrared cut filter, or an anti-reflection layer formed of an inorganic multilayer film is provided on a surface of the near-infrared cut filter. In this case, if adhesiveness between the resin layer and the transparent substrate or between the resin layer and the inorganic multilayer film is low, various troubles may occur due to peeling. For this reason, the resin layer is required to have high adhesiveness with respect to the transparent substrate such as a glass substrate, or the inorganic multilayer film.

Further, even if the near-infrared cut filter tries to obtain both properties of a high cutoff property of near-infrared light and a high transmitting property of visible light, it never exhibits a 100% transmittance in the entire region of visible light, for example, and a region with relatively low transmittance sometimes exists even in the visible region.

For example, a squarylium-based dye is excellent in cutoff property of near-infrared light, has a certain level of more of transmittance of visible light, and has a transmittance of light from the visible region toward the near-infrared region, which changes steeply. For example, the present applicant has made an application before regarding an optical filter containing a squarylium-based dye having an amide group (Patent Reference 1), in which color reproducibility which is sufficient to some degree is obtained through a spectral transmittance characteristic of the optical filter. However, even the squarylium-based dye having the amide group collaterally has more or less absorption in the visible region. In particular, a transmittance of light of a wavelength range of 430 to 550 nm is lower than a transmittance of light with another wavelength in the visible region, so that precision of color reproducibility when capturing an image with blue color, in particular, is at a practical level, but has been sometimes rather insufficient. Further, although a resin layer (absorption layer) containing the squarylium-based dye having the amide group also has a certain level or more of adhesiveness with respect to an inorganic material such as a glass, it has been demanded to have adhesiveness of higher level.

Under such circumstances, various squarylium-based dyes having a new structure also have been proposed in order to increase the transmittance of visible light, but, they have not reached a satisfactory level yet (Patent References 2 and 3). Further, there has been proposed an optical filter which uses a squarylium-based dye and a phthalocyanine-based dye in combination, to thereby enhance a cutoff property in a near-ultraviolet region in particular (Patent Reference 4). However, Patent Reference 4 does not disclose a technique of increasing a transmittance of light of a wavelength range of 430 to 550 nm in particular, as the transmitting property of visible light. Further, since two or more different dyes are used, there is a possibility that absorption of visible light collaterally increases, on the contrary. Further, a technique which takes adhesiveness between a resin layer containing a dye and an inorganic material such as a glass into consideration has not been reported yet. Further, no description has been made in particular regarding light durability (light resistance) as well.

SUMMARY

The present invention has an object to provide an optical filter including an absorption layer which increases a visible light transmittance while having a good near-infrared blocking characteristic, and which is excellent in not only adhesiveness with respect to a substrate, an inorganic multilayer film, and the like, but also light resistance, and a highly-reliable imaging device using the optical filter.

An optical filter according to one aspect of the present invention is characterized in that it is an optical filter including: an absorption layer containing a near-infrared absorbing dye and a transparent resin; and an inorganic or organic material in contact with the absorption layer, in which the near-infrared absorbing dye contains a squarylium-based dye of Formula (AI).

[Chemical Formula 1]

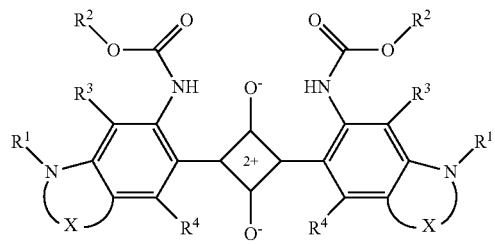

(AI)

wherein each X is independently a bivalent organic group of Formula (1) or Formula (2), wherein one or more hydrogen atoms may be substituted with a $C_{1-12}$ alkyl or alkoxy group;

$$—(CH_2)_{n1}— \qquad (1)$$

wherein n1 is 2 or 3;

$$—(CH_2)_{n2}—O—(CH_2)_{n3}— \qquad (2)$$

wherein each of n2 and n3 is independently an integer of 0 to 2, and n2+n3 is 1 or 2;

each R1 independently represents a saturated or unsaturated $C_{1-12}$ hydrocarbon group which may contain a saturated ring structure or may be branched, a saturated $C_{3-12}$ cyclic hydrocarbon group, a $C_{6-12}$ aryl group, or a $C_{7-13}$ alaryl group, which may contain a saturated ring structure;

each $R^2$ is independently a $C_{1-25}$ hydrocarbon group in which one or more hydrogen atoms may be substituted with a halogen atom, a hydroxyl group, a carboxy group, a sulfo group, or a cyano group and that may contain an unsaturated bond, an oxygen atom, or a saturated or unsaturated ring structure between carbon atoms; and $R^3$ and $R^4$ each independently represent a hydrogen atom, a halogen atom, or a $C_{1-10}$ alkyl or alkoxy group.

Further, an imaging device according to another aspect of the present invention is characterized in that it includes the above-described optical filter.

According to the present invention, it is possible to obtain an optical filter including an absorption layer which increases a visible light transmittance while having a good near-infrared blocking characteristic, and which is excellent in not only adhesiveness with respect to a substrate, an inorganic multilayer film, and the like, but also light resistance. Further, it is possible to obtain an imaging device with high reliability using such an optical filter.

DETAILED DESCRIPTION

Hereinafter, embodiments of the present invention will be described. Note that in the following description, an optical filter is sometimes abbreviated as "NIR filter," a near-infrared absorbing dye is sometimes abbreviated as "NIR absorbing dye" or "NIR dye," and an ultraviolet absorbing dye is sometimes abbreviated as "UV absorbing dye" or "UV dye."

<NIR Filter>

The NIR filter of one embodiment of the present invention (referred to as "present filter," hereinafter) has a first layer, and a second layer in contact with the first layer and which is different from the first layer.

The first layer is an absorption layer containing a near-infrared absorbing dye (A) and a transparent resin (B). The second layer is a layer made of an inorganic or organic material, and is, for example, a transparent substrate including a glass substrate, a transparent resin substrate, or the like, a selected wavelength blocking layer made of a dielectric multilayer film which blocks light in a specific wavelength region, an anti-reflection layer made of a dielectric multilayer film which suppresses a transmittance loss in a visible region, or the like.

Each of the first layer and the second layer may have one layer or two layers or more in the present filter. When each of the layers has two layers or more, each layer may have the same configuration or different configuration. Further, the first layer itself may be one functioning as a substrate (resin substrate).

The present filter may also have a layer other than the first layer and the second layer, namely, a third layer which is not in contact with the first layer. The transparent substrate such as the glass substrate or the resin substrate, the selected wavelength blocking layer made of the dielectric multilayer film which blocks light in the specific wavelength region, or the anti-reflection layer made of the dielectric multilayer film which suppresses the transmittance loss of visible light described above, may also be included as the third layer.

Hereinafter, typical configuration examples of the present filter will be explained by using the drawings.

Figure 1A:
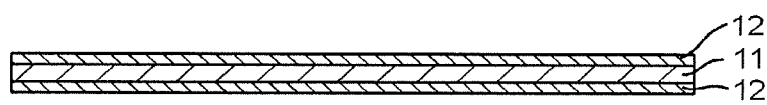
FIG. 1A is a sectional view schematically illustrating an example of an optical filter of one embodiment.

FIG. 1A illustrates a configuration example in which a selected wavelength blocking layer 12 made of a dielectric multilayer film is provided, as a second layer, on each of both of main surfaces of an absorption layer (first layer) 11.

Figure 1B:
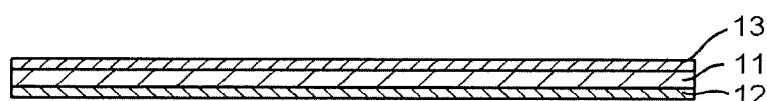
FIG. 1B is a sectional view schematically illustrating another example of the optical filter of one embodiment.

FIG. 1B illustrates a configuration example in which the selected wavelength blocking layer 12 made of the dielectric multilayer film and an anti-reflection layer 13 made of a dielectric multilayer film are respectively provided, as second layers, on both of the main surfaces of the absorption layer (first layer) 11.

Figure 1C:
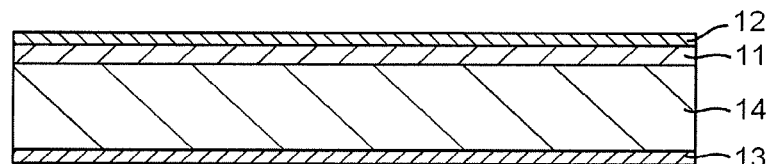
FIG. 1C is a sectional view schematically illustrating another example of the optical filter of one embodiment.

FIG. 1C illustrates a configuration example in which a transparent substrate 14 and the selected wavelength blocking layer 12 made of the dielectric multilayer film are respectively provided, as second layers, on both of the main surfaces of the absorption layer (first layer) 11. In this example, the anti-reflection layer 13 made of the dielectric multilayer film is further provided, as a third layer, on a main surface of the transparent substrate 14 on an opposite side of the absorption layer (first layer) 11.

Figure 1D:
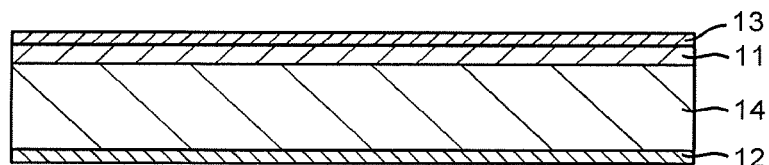
FIG. 1D is a sectional view schematically illustrating another example of the optical filter of one embodiment.

FIG. 1D illustrates a configuration example in which the transparent substrate 14 and the anti-reflection layer 13 made of the dielectric multilayer film are respectively provided, as second layers, on both of the main surfaces of the absorption layer (first layer) 11. In this example, the selected wavelength blocking layer 12 made of the dielectric multilayer film is further provided, as the third layer, on a main surface of the transparent substrate 14 on an opposite side of the absorption layer (first layer) 11 side.

In FIG. 1A, the two selected wavelength blocking layers 12 may be the same or different. For example, it is also possible to configure such that one of the selected wavelength blocking layers reflects ultraviolet light and light in a first near-infrared region, and the other selected wavelength blocking layer 12 reflects ultraviolet light and light in a second near-infrared region which is different from the first near-infrared region.

The present filter preferably has a spectral transmittance characteristic satisfying (iv-1), and more preferably satisfies (iv-1) and at least one of (iv-2) to (iv-6). It is particularly preferable that the present filter satisfies all of (iv-1) to (iv-6).

(iv-1) In a spectral transmittance curve at an incident angle of 0°, an average transmittance of light of a wavelength range of 430 to 550 nm is 90% or more, and a minimum transmittance of light of a wavelength range of 430 to 550 nm is 75% or more.

(iv-2) In a spectral transmittance curve at an incident angle of 0°, an average transmittance of light of a wavelength range of 600 to 700 nm is 25% or more.

(iv-3) In a spectral transmittance curve at an incident angle of 0°, an average transmittance of light of a wavelength range of 350 to 395 nm is 2% or less.

(iv-4) In a spectral transmittance curve at an incident angle of 0°, an average transmittance of light of a wavelength range of 710 to 1100 nm is 2% or less.

(iv-5) An average value of absolute values each being a difference between a transmittance of light of a wavelength range of 385 to 430 nm in a spectral transmittance curve at an incident angle of 0° and a transmittance of light of a wavelength range of 385 to 430 nm in a spectral transmittance curve at an incident angle of 30° (hereinafter, referred to as "transmittance average shift amount of wavelength of 385 to 430 nm") is 7%/nm or less.

(iv-6) An average value of absolute values each being a difference between a transmittance of light of a wavelength range of 600 to 700 nm in a spectral transmittance curve at an incident angle of 0° and a transmittance of light of a wavelength range of 600 to 700 nm in a spectral transmittance curve at an incident angle of 30° (hereinafter, referred to as "transmittance average shift amount of wavelength of 600 to 700 nm") is 7%/nm or less.

By satisfying (iv-1), the transmittance of light with the wavelength of 430 to 550 nm can be increased, and it is possible to further increase the precision of color reproducibility when capturing an image with blue color.

By satisfying (iv-2), it is possible to maintain a relatively high transmittance of light with the wavelength of 600 to 700 nm, which is involved in visibility of a human being, while cutting light of a wavelength range of 700 nm or more, which is unnecessary for a solid-state image sensing element.

By satisfying (iv-3), it is possible to block light in a wavelength region of 395 nm or less, and to make spectral sensitivity of a solid-state image sensing element approximate to visibility of a human being.

By satisfying (iv-4), it is possible to block light with the wavelength of 710 to 1100 nm, and to make spectral sensitivity of a solid-state image sensing element approximate to visibility of a human being.

By satisfying (iv-5), it is possible to decrease incident angle dependence of light with the wavelength of 385 to 430 nm. As a result of this, it is possible to decrease incident angle dependence of spectral sensitivity of a solid-state image sensing element in this wavelength region.

By satisfying (iv-6), it is possible to decrease incident angle dependence of light with the wavelength of 600 to 700 nm. As a result of this, it is possible to decrease incident angle dependence of spectral sensitivity of a solid-state image sensing element in this wavelength region.

In the spectral transmittance curve at the incident angle of 0°, the average transmittance of light with the wavelength of 430 to 550 nm in the present filter is more preferably 91% or more, and still more preferably 92% or more. A larger amount of visible light can be taken into the optical filter as the average transmittance of light with the wavelength of 430 to 550 nm in the optical filter becomes higher.

In the spectral transmittance curve at the incident angle of 0°, the minimum transmittance of light with the wavelength of 430 to 550 nm in the present filter is more preferably 77% or more, and still more preferably 80% or more. A larger amount of visible light can be taken into the optical filter as the minimum transmittance of light with the wavelength of 430 to 550 nm in the optical filter becomes higher.

In the spectral transmittance curve at the incident angle of 0°, the average transmittance of light with the wavelength of 600 to 700 nm in the present filter is more preferably 30% or more. As the average transmittance of light with the wavelength of 600 to 700 nm in the optical filter becomes higher, a higher transmittance of light with the wavelength of 600 to 700 nm which is involved in visibility of a human being can be maintained, while further cutting light with the wavelength of 700 nm or more, which is unnecessary for the visibility.

Further, in the spectral transmittance curve at the incident angle of 0°, the average transmittance of light with the wavelength of 430 to 480 nm in the present filter is preferably 87% or more, more preferably 88% or more, still more preferably 89% or more, and further preferably 90% or more. As the average transmittance of light with the wavelength of 430 to 480 nm in the optical filter is higher, the precision of color reproducibility of a blue color can be increased.

In the spectral transmittance curve at the incident angle of 0°, the average transmittance of light with the wavelength of 350 to 395 nm in the present filter is more preferably 1.5% or less, still more preferably 1% or less, and further preferably 0.5% or less. As the average transmittance of light with the wavelength of 350 to 395 nm in the optical filter is lower, it is possible to cut light with a wavelength which is unnecessary as a solid-state image sensing element.

In the spectral transmittance curve at the incident angle of 0°, the average transmittance of light with the wavelength of 710 to 1100 nm in the present filter is more preferably 1% or less, still more preferably 0.5% or less, and further preferably 0.3% or less. As the average transmittance of light with the wavelength of 710 to 1100 nm in the optical filter is lower, it is possible to cut light with a wavelength which is unnecessary as a solid-state image sensing element.

In the present filter, the transmittance average shift amount of the wavelength of 385 to 430 nm is more preferably 6%/nm or less, and still more preferably 5%/nm or less. The transmittance average shift amount of the wavelength of 385 to 430 nm is an index indicating the incident angle dependence of light of the present filter at the wavelength of 385 to 430 nm. It is indicated that the smaller this value, the lower the incident angle dependence.

In the present filter, the transmittance average shift amount of the wavelength of 600 to 700 nm is more preferably 3%/nm or less, and still more preferably 2%/nm or less. The transmittance average shift amount of the wavelength of 600 to 700 nm is an index indicating the incident angle dependence of light of the present filter at the wavelength of 600 to 700 nm. It is indicated that the smaller this value, the lower the incident angle dependence.

Next, the absorption layer, the selected wavelength blocking layer, the anti-reflection layer, and the transparent substrate, which form the present filter will be explained.

[Absorption Layer]

The absorption layer is a layer which contains a near-infrared absorbing dye (A) and a transparent resin (B), and typically is a layer or a (resin) substrate obtained in a manner that the near-infrared absorbing dye (A) is evenly dissolved or dispersed in the transparent resin (B). The absorption layer may further contain an ultraviolet absorbing dye (U).

As described above, a plurality of absorption layers may also be provided in the present filter according to circumstances.

(Near-Infrared Absorbing Dye (A))

The near-infrared absorbing dye (A) (also referred to as NIR dye (A), hereinafter) contained in the absorption layer of the present filter, contains at least one selected from NIR dyes of Formula (AI).

In the present specification, the NIR dye of Formula (AI) is also referred to as a NIR dye (AI). The same applies to other dyes. Further, as will be described later, a group of Formula (1n) is described as a group (1n), for example. Groups represented by other formulas are also described in a similar manner.

[Chemical Formula 2]

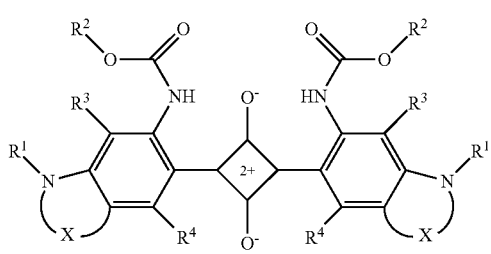

(AI)

each X is independently a bivalent organic group of Formula (1) or Formula (2), wherein one or more hydrogen atoms may be substituted with a $C_{1-12}$ alkyl or alkoxy group;

$$—(CH_2)_{n1}— \qquad (1)$$

wherein n1 is 2 or 3;

$$—(CH_2)_{n2}—O—(CH_2)_{n3}— \qquad (2)$$

wherein each of n2 and n3 is independently an integer of 0 to 2, and n2+n3 is 1 or 2;

each R1 independently represents a saturated or unsaturated $C_{1-12}$ hydrocarbon group which may contain a saturated ring structure or may be branched, a saturated $C_{3-12}$ cyclic hydrocarbon group, a $C_{6-12}$ aryl group, or a $C_{7-13}$ alaryl group;

each $R^2$ is independently a $C_{1-25}$ hydrocarbon group in which one or more hydrogen atoms may be substituted with a halogen atom, a hydroxyl group, a carboxy group, a sulfo group, or a cyano group and that may contain an unsaturated bond, an oxygen atom, or a saturated or unsaturated ring structure between carbon atoms; and $R^3$ and $R^4$ each independently represent a hydrogen atom, a halogen atom, or a $C_{1-10}$ alkyl or alkoxy group.

Note that in the present specification, the saturated or unsaturated ring structure refers to a hydrocarbon ring and a heterocycle having an oxygen atom as an annular atom. Further, it is set that a structure in which a $C_{1-10}$ alkyl group is bonded to a carbon atom constituting a ring is also included in a category of the saturated or unsaturated ring structure.

Further, the aryl group refers to a group that is bonded via a carbon atom constituting an aromatic ring possessed by an aromatic compound, for example, a benzene ring, a naphthalene ring, biphenyl, a furan ring, a thiophene ring, a pyrrole ring, or the like. The alaryl group refers to a linear or branched, saturated or unsaturated hydrocarbon group or a saturated cyclic hydrocarbon group, which may contain a saturated ring structure, which is substituted with one or more aryl groups.

The NIR dye (AI) has a squarylium skeleton in a center of a molecular structure and has one condensed ring structure on each of the left and right sides, in which one benzene ring is bonded to each of the left and right sides of the squarylium skeleton, each benzene ring thereof is bonded to a nitrogen atom at a fourth position, and a heterocycle including the nitrogen atom and the fourth-position and fifth-position carbon atoms of the benzene ring is formed. Further, the NIR dye (AI) is bonded to an urethane group, which is of Formula (a1), in the second position of the one benzene ring on each of the left and right sides.

[Chemical Formula 3]

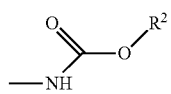

(a1)

In the NIR dye (AI), the constitution of the ring other than the benzene ring constituting one condensed ring structure which exists on each of the left and right sides is determined by the above-described X, and is each independently a heterocycle having a ring number of 5 or 6. The bivalent group X constituting a part of the heterocycle may have a skeleton constituted only of carbon atoms as represented in Formula (1), or it may contain oxygen atoms other than the carbon atoms as represented in Formula (2). In Formula (2), the position of the oxygen atom is not particularly limited. Specifically, a nitrogen atom and an oxygen atom may be bonded, or an oxygen atom may be bonded directly to the benzene ring. Further, an oxygen atom may be positioned so as to be sandwiched by carbon atoms.

Note that X on the left and right sides may be the same or different, but, they are preferably the same from the viewpoint of productivity. Further, $R^1$ to $R^4$ may be the same or different on the left and right sides across the squarylium skeleton, but, they are preferably the same from the viewpoint of productivity.

In the NIR dye (AI), the urethane group is bonded in the second position of the benzene rings bonded on the left and right sides of the squarylium skeleton, as described above, and accordingly, it is possible to increase adhesiveness with respect to not only a layer made of an organic material but also a layer made of an inorganic material such as a glass or a dielectric multilayer film in particular, as a layer in contact with the absorption layer containing the NIR dye (AI), while having a spectral transmittance characteristic in the near-infrared region and the visible region, which is equivalent to or higher than that of a conventional squarylium-based dye. This can be considered because the urethane group is contained, polarity of the NTR dye itself is increased, resulting in that a chemical interaction between the NIR dye and the inorganic material such as a glass increases.

Further, since the NIR dye (AI) has the urethane group as described above, it is possible to increase light resistance of the absorption layer, to thereby impart good light resistance to the optical filter. Note that the light resistance of the optical filter can be evaluated in a manner that, for example, the optical filter is irradiated with light for a certain period of time, and the light resistance is evaluated from a variation amount of the maximum transmittance in a predetermined wavelength region before and after the irradiation, and the smaller the maximum transmittance variation amount, the higher the light resistance.

Irradiation device: xenon lamp (wavelength of 300 to 2450 nm)
Temperature: 40° C.
Humidity: 50% RT
Integrated light amount: 87.2 kw·h/m²

Further, the NIR dye (AI) has good solubility to an organic solvent, and therefore its compatibility to the transparent resin is also good. As a result of this, even when the thickness of the absorption layer is reduced, an excellent spectral characteristic is exhibited, resulting in that the optical filter can be reduced in size and thickness. Further, since the NIR dye (AI) enables reduction in the thickness of the absorption layer, it is possible to suppress thermal expansion of the absorption layer by heating, and at the time of forming the selected wavelength blocking layer and another functional layer, for example, an anti-reflection layer, it is possible to suppress occurrence of cracks or the like in these layers.

Note that from the viewpoint of solubility to an organic solvent and compatibility to the transparent resin, a substituent $R^1$ is preferably a group having a branch structure, and more preferably an alkyl or alkoxy group having a branch structure.

X in the NIR dye (AI) is preferably a bivalent organic group of Formula (3).

$$—CR^5{}_2—(CR^6{}_2)_{n4}— \quad (3)$$

where Formula (3) represents a bivalent group in which the left side is bonded to the benzene ring and the right side is bonded to N, and n4 is 1 or 2. n4 is preferably 1. Further, each $R^5$ is independently a $C_{1-12}$ alkyl or alkoxy group that may be branched, and preferably a $C_{1-6}$ alkyl or alkoxy group that may be branched. Furthermore, each $R^6$ is independently a hydrogen atom or a $C_{1-12}$ alkyl or alkoxy group that may be branched, and preferably a hydrogen atom or a $C_{1-6}$ alkyl or alkoxy group that may be branched.

As X in Formula (AI), any of bivalent organic groups of Formulas (11-1) to (12-3) is particularly preferable. Note that each of Formulas (11-1) to (12-3) represents a bivalent group in which the left side is bonded to the benzene ring and the right side is bonded to N.

$—C(CH_3)_2—CH(CH_3)—$ (11-1)

$—C(CH_3)_2—CH_2—$ (11-2)

$—C(CH_3)_2—CH(C_2H_5)—$ (11-3)

$—C(CH_3)_2—CH_2—CH_2—$ (12-1)

$—C(CH_3)_2—CH_2—CH(CH_3)—$ (12-2)

$—C(CH_3)_2—CH(CH_3)—CH_2—$ (12-3)

Among them, X in Formula (AI) is preferably any of the groups (11-1) to (11-3), and more preferably the group (11-1).

Structural formulas of a NIR dye (Ai) in which X is the group (11-1) on both left and right sides will be given below. Note that in the NIR dye (Ai), $R^1$ to $R^4$ are of the same meaning as $R^1$ to $R^4$ in the NIR dye (AI).

[Chemical Formula 4]

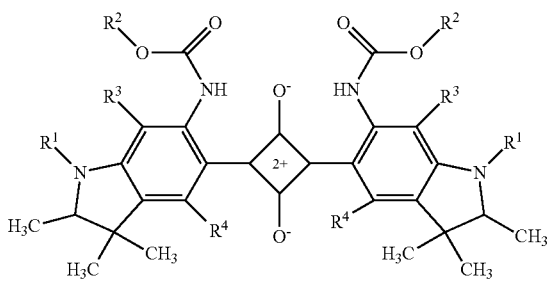

(Ai)

Further, from the viewpoint of steepness of change in the vicinity of a boundary between the visible region and the near-infrared region in the spectral transmittance curve, and further, solubility, heat resistance, and the like, $R^1$ in the NIR dye (AI) is each independently more preferably a group of Formula (4-1) or Formula (4-2).

[Chemical Formula 5]

(4-1)

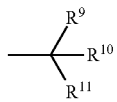

(4-2)

In Formula (4-1) and Formula (4-2), each of $R^7$, $R^8$, $R^9$, $R^{10}$, and $R^{11}$ independently represent a hydrogen atom, a halogen atom, or a $C_{1-4}$ alkyl group with a carbon number of 1 to 4.

Further, $R^3$ and $R^4$ in the NIR dye (AI) are each independently preferably a hydrogen atom, a halogen atom, or a $C_{1-6}$ alkyl or alkoxy group. It is more preferable that each of $R^3$ and $R^4$ is a hydrogen atom.

As the NIR dye (AI), the NIR dye (Ai) is preferable, and furthermore, NIR dyes (A1-1) to (A1-13) having constitutions indicated in Table 1 are more preferable. Further, from the viewpoint of solubility of the dye, the NIR dyes (A1-2) to (A1-4), (A1-6) to (A1-8), and (A1-10) to (A1-13) are particularly preferable. Note that in the NIR dyes (A1-1) to (A1-13), two $R^1$ in total existing one each on the left and right sides are the same on the left and right sides, and the same applies to $R^2$ to $R^4$

TABLE 1

| Dye | Structural formula | Substituent | | |
|---|---|---|---|---|
| | | $R^1$ | $R^2$ | $R^3$ $R^4$ |
| (A1-1) | (Ai) | —CH$_3$ | —CH$_3$ | H H |
| (A1-2) | | —CH$_3$ | —CH$_2$CH$_2$CH$_3$ | H H |
| (A1-3) | | —CH$_3$ | —CH$_2$(CH$_2$)$_3$CH$_3$ | H H |
| (A1-4) | | —CH$_3$ | —CH$_2$CH(C$_2$H$_5$)C$_4$H$_9$ | H H |

TABLE 1-continued

| Dye | Structural formula | R¹ | R² | R³ | R⁴ |
|---|---|---|---|---|---|
| (A1-5) | | —CH₃ | ⌬—CH₂CH₂CH₃ | H | H |
| (A1-6) | | —CH(CH₃)₂ | —CH₂CH₂CH₃ | H | H |
| (A1-7) | | —CH(CH₃)₂ | —CH₂(CH₂)₃CH₃ | H | H |
| (A1-8) | | —CH(CH₃)₂ | —CH(CH₃)₂ | H | H |
| (A1-9) | | —CH(CH₃)₂ | ⌬—CH₂CH₂CH₃ | H | H |
| (A1-10) | | —(CH₃)₂CCH₂CH₃ | —CH₂CH₂CH₃ | H | H |
| (A1-11) | | —(CH₃)₂CCH₂CH₃ | —CH₂(CH₂)₃CH₃ | H | H |
| (A1-12) | | —(C₂H₅)₂CCH₃ | —CH₂CH₂CH₃ | H | H |
| (A1-13) | | —(C₂H₅)₂CCH₃ | —CH₂(CH₂)₃CH₃ | H | H |

The NIR dye (AI) can be produced by a method described in International Publication Pamphlet No. WO14/088063, for example. Concretely, the NIR dye (AI) can be produced by causing a reaction between 3,4-dihydroxy-3-cyclobutene-1,2-dione (squaric acid) and a compound having a condensed ring capable of forming the structure of Formula (AI) by bonding to the squaric acid. For example, when the NIR dye (AI) has a bilaterally symmetrical structure, it is only required to cause a reaction of the compound with equivalent weight of 2 having a condensed ring of a desired structure in the above-described range with the squaric acid with equivalent weight of 1.

Hereinafter, as a concrete example, a reaction path at a time of obtaining the NIR dye (Ai) will be described. The squaric acid is represented by (s) in Reaction Formula (F1). According to Reaction Formula (F1), an amino group is introduced (f) into a benzene ring of a compound (d) having desired substituents (R¹, R³, R⁴) in an indole skeleton, and further, chloroformic acid ester (g) having a desired substituent R² is made to react therewith, thereby obtaining an urethane compound (h). The urethane compound (h) with equivalent weight of 2 is made to react with the squaric acid (s) with equivalent weight of 1, thereby obtaining the NIR dye (Ai).

[Chemical Formula 6]

(F1)

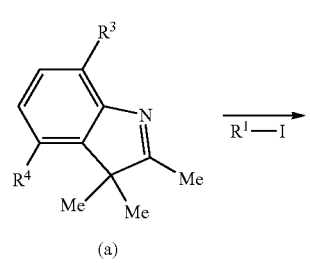

(a)

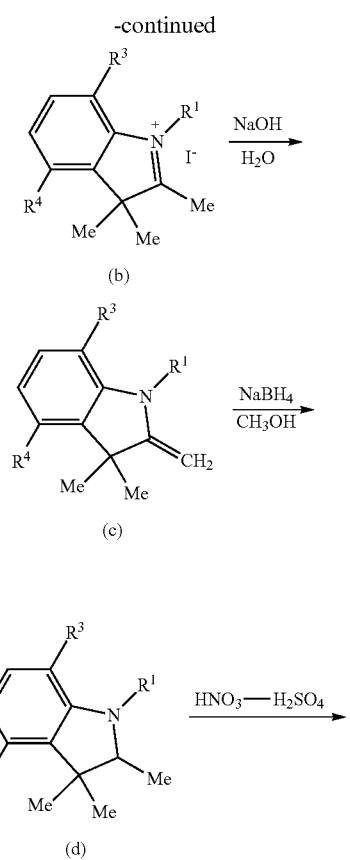

-continued

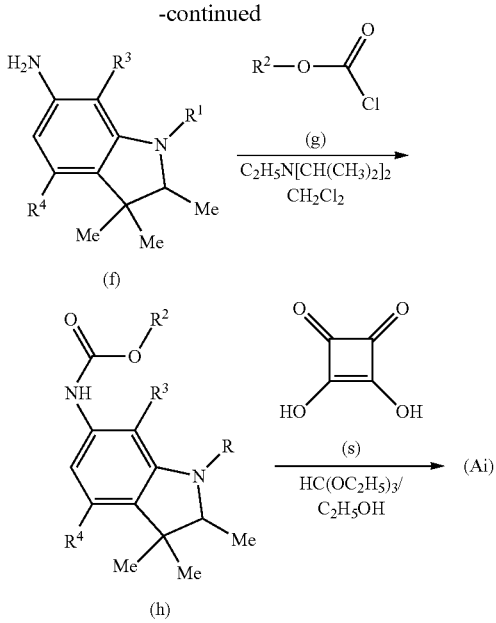

In Reaction Formula (F1), $R^1$ to $R^4$ are of the same meaning as $R^1$ to $R^4$ in Formula (Ai), Me represents a methyl group, and THF represents tetrahydrofuran. Hereinafter, in the present specification, Me and THF are used by the same meaning as described above.

In the present embodiment, the NIR dye (AI) is preferably one whose absorption characteristic measured by dissolved in dichloromethane satisfies (i-1) to (i-3).

(i-1) In an absorption spectrum of a wavelength of 400 to 800 nm, there is a maximum absorption wavelength $\lambda_{max}$ in a wavelength region of 670 to 730 nm, preferably 680 to 720 nm, and more preferably 690 to 710 nm.

(i-2) Between a maximum absorption constant $\varepsilon_A$ of light of a wavelength range of 430 to 550 nm and a maximum absorption constant $\varepsilon_B$ of light of a wavelength range of 670 to 730 nm, the following relational expression is satisfied.

$\varepsilon_B/\varepsilon_A \geq 50$

This relational expression is preferably $\varepsilon_B/\varepsilon_A \geq 60$, and more preferably $\varepsilon_B/\varepsilon_A \geq 70$.

(i-3) In a spectral transmittance curve, a difference $\lambda_{max}-\lambda_{80}$ between a wavelength $\lambda_{80}$ at which a transmittance becomes 80% on a shorter wavelength side than the maximum absorption wavelength $\lambda_{max}$ with a transmittance at the maximum absorption wavelength $\lambda_{max}$ set to 10% and the maximum absorption wavelength $\lambda_{max}$, is 60 nm or less. $\lambda_{max}-\lambda_{80}$ is preferably 55 nm or less, and more preferably 50 nm or less.

By using the NIR dye (A) satisfying (i-1) to (i-3), it is possible to obtain an optical filter with high reliability and excellent in adhesiveness with respect to a layer to be abutted, while having intended good near-infrared blocking characteristic.

Concretely, by satisfying (i-1), it is possible to sufficiently block near-infrared light. Further, by satisfying (i-2), it is possible to sufficiently transmit visible light. Furthermore, by satisfying (i-3), it is possible to make a change in the vicinity of a boundary between the visible region and the near-infrared region (transmittance transition range) steep in the spectral transmittance curve.

In the present embodiment, the NIR dye (A) may also contain a dye other than the NIR dye (AI) according to need within a range not impairing the effects of the present invention. From the viewpoint of adhesiveness, it is preferable to use only the NIR dye (AI).

The content of the NIR dye (A) in the absorption layer is preferably 0.1 to 30 parts by mass relative to 100 parts by mass of the transparent resin (B). By setting the content to 0.1 parts by mass or more, it is possible to obtain a desired near-infrared absorbing capability, and by setting the content to 30 parts by mass or less, a decrease in near-infrared absorbing capability, an increase in haze value, and the like are suppressed. The content of the NIR dye (A) is more preferably 0.5 to 25 parts by mass, and still more preferably 1 to 20 parts by mass.

(Ultraviolet Absorbing Dye (U))

The absorption layer can contain an UV dye (U), in addition to the NIR dye (A) and the transparent resin. As the UV dye (U) (also referred to as dye (U), hereinafter), one satisfying (ii-1) is preferable.

(ii-1) In an absorption spectrum (hereinafter, referred to as "absorption spectrum of UV dye (U)") of a wavelength of 350 to 800 nm measured by dissolved in dichloromethane, there is a maximum absorption wavelength in a wavelength region of 360 to 415 nm.

When the UV dye (U) satisfying (ii-1) is used, it is possible to obtain a good ultraviolet blocking characteristic without decreasing the transmittance at a wavelength of equal to or greater than 430 nm, because the maximum absorption wavelength has appropriate and steep rising of the absorption spectrum.

In the absorption spectrum of the UV dye (U), the maximum absorption wavelength of the UV dye (U) more preferably exists in a wavelength region of 370 to 415 nm, and still more preferably exists in a wavelength region of 390 to 410 nm.

As concrete examples of an UV dye (hereinafter, referred to as UV dye (U1)) satisfying (ii-1) suitable for the present embodiment, there can be cited dyes of oxazole-base, merocyanine-base, cyanine-base, naphthalimide-base, oxadiazole-base, oxazine-base, oxazolidine-base, naphthalic acid-base, styryl-base, anthracene-base, cyclic carbonyl-base, triazole-base, and the like.

As the UV dye (U1), an UV dye of Formula (N) (UV dye (N)) can also be cited.

[Chemical Formula 7]

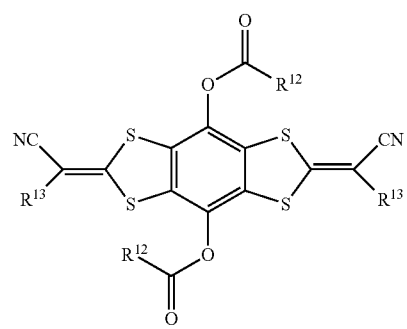

In Formula (N), each $R^{12}$ independently represents a $C_{1-20}$ hydrocarbon group that may contain a saturated or unsaturated ring structure and may be branched. Concretely, there can be cited a linear or branched alkyl group, alkenyl group, saturated cyclic hydrocarbon group, aryl group, alaryl group, or the like.

Further, in Formula (N), each $R^{13}$ is independently a cyano group or a group of Formula (n).

$$—COOR^{30} \quad (n)$$

In Formula (n), $R^{30}$ represents a $C_{1-20}$ hydrocarbon group that may contain a saturated or unsaturated ring structure and may be branched. Concretely, there can be cited an alkyl group, an alkenyl group, a saturated cyclic hydrocarbon group, an aryl group, and an alaryl group of linear chain or branched chain, or the like.

As $R^{12}$ in the UV dye (N), among others, groups of Formulas (1n) to (4n) are preferable. Further, as $R^{13}$ in the UV dye (N), among others, a group of Formula (5n) is preferable.

[Chemical Formula 8]

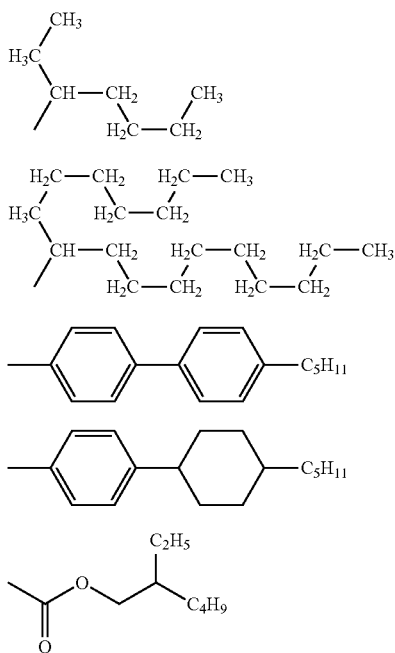

As the UV dye (N), UV dyes (N-1) to (N-4) having constitutions indicated in Table 2 can be exemplified. Note that concrete structures of $R^{12}$ and $R^{13}$ in Table 2 correspond to Formulas (1n) to (5n). Table 2 also illustrates corresponding dye abbreviations. Note that in the UV dyes (N-1) to (N-4), two existing $R^{12}$ are the same, and $R^{13}$ are the same as well.

TABLE 2

| Dye Abbreviation | $R^{12}$ | $R^{13}$ |
|---|---|---|
| N-1 | 1n | 5n |
| N-2 | 2n | 5n |
| N-3 | 3n | 5n |
| N-4 | 4n | 5n |

Among the UV dyes (U1) exemplified above, the dyes of oxazole-base and merocyanine-base are preferable, and as commercial products thereof, there can be cited, for example, Uvitex (registered trademark) OB, Hakkol (registered trademark) RF-K, and S0511.

(Merocyanine-Based Dye)

As the UV dye (U1), a merocyanine-based dye of Formula (M) is preferable in particular.

[Chemical Formula 9]

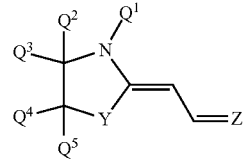

In Formula (M), Y represents a methylene group or an oxygen atom substituted with $Q^6$ and $Q^7$. Here, each of $Q^6$ and $Q^7$ independently represents a hydrogen atom, a halogen atom, or a $C_{1-10}$ alkyl or alkoxy group. Each of $Q^6$ and $Q^7$ is independently preferably a hydrogen atom or a $C_{1-10}$ alkyl or alkoxy group, and it is more preferable that each of them is a hydrogen atom or at least one of them is a hydrogen atom and the other is a $C_{1-4}$ alkyl group. It is particularly preferable that each of $Q^6$ and $Q^7$ is a hydrogen atom.

$Q^1$ represents a monovalent $C_{1-12}$ hydrocarbon group that may have a substituent. As the monovalent hydrocarbon group having no substituent, it is preferable to use a $C_{1-12}$ alkyl group in which a part of hydrogen atoms may be substituted with an aliphatic ring, an aromatic ring or an alkenyl group, a $C_{3-8}$ cycloalkyl group in which a part of hydrogen atoms may be substituted with an aromatic ring, an alkyl group or an alkenyl group, and a $C_{6-12}$ aryl group in which a part of hydrogen atoms may be substituted with an aliphatic ring, an alkyl group or an alkenyl group.

When $Q^1$ is an unsubstituted alkyl group, this alkyl group may be of either linear or branched, and a carbon number thereof is more preferably 1 to 6.

As the $C_{1-12}$ alkyl group in which a part of hydrogen atoms is substituted with an aliphatic ring, an aromatic ring, or an alkenyl group, a $C_{1-4}$ alkyl group having a $C_{3-6}$ cycloalkyl group, and a $C_{1-4}$ alkyl group that is substituted with a phenyl group are more preferable, and a $C_1$ or $C_2$ alkyl group that is substituted with a phenyl group is particularly preferable. Note that the alkyl group substituted with an alkenyl group means one that is an alkenyl group in its entirety but has no unsaturated bond between a first position and a second position, which is, for example, an allyl group, 3-butenyl group, or the like.

As the hydrocarbon group having a substituent, a hydrocarbon group having one or more of an alkoxy group, an acyl group, an acyloxy group, a cyano group, a dialkylamino group or a chlorine atom is preferable. The carbon number of these alkoxy group, acyl group, acyloxy group and dialkylamino group is preferably 1 to 6.

A preferable $Q^1$ is a $C_{1-6}$ alkyl group in which a part of hydrogen atoms may be substituted with a cycloalkyl group or a phenyl group.

A particularly preferable $Q^1$ is a $C_{1-6}$ alkyl group, and concretely, there can be cited, for example, a methyl group, an ethyl group, a propyl group, an isopropyl group, a butyl group, an isobutyl group, a t-butyl group, and the like.

Each of $Q^2$ to $Q^5$ independently represents a hydrogen atom, a halogen atom, or a $C_{1-10}$ alkyl or alkoxy group. The carbon number of the alkyl group and the alkoxy group is preferably 1 to 6, and more preferably 1 to 4.

At least one of $Q^2$ and $Q^3$ is preferably an alkyl group, and it is more preferable that each of them is an alkyl group.

When $Q^2$ or $Q^3$ is not an alkyl group, it is more preferably a hydrogen atom. It is particularly preferable that each of $Q^2$ and $Q^3$ is a $C_{1-6}$ alkyl group.

At least one of $Q^4$ and $Q^5$ is preferably a hydrogen atom, and it is more preferable that each of them is a hydrogen atom. When $Q^4$ or $Q^5$ is not a hydrogen atom, it is preferably a $C_{1-6}$ alkyl group.

Z represents any of bivalent groups of Formulas (Z1) to (Z5).

[Chemical Formula 10]

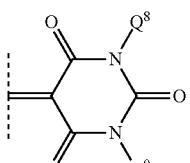
(Z1)

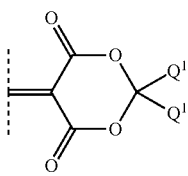
(Z2)

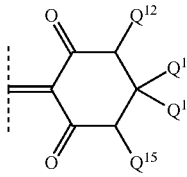
(Z3)

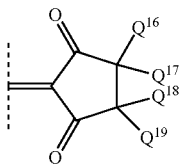
(Z4)

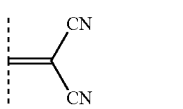
(Z5)

In Formulas (Z1) to (Z5), each of $Q^8$ and $Q^9$ independently represents a monovalent $C_{1-12}$ hydrocarbon group that may have a substituent. $Q^8$ and $Q^9$ may be different groups, but, they are preferably the same group.

As the monovalent hydrocarbon group having no substituent, a $C_{1-12}$ alkyl group in which a part of hydrogen atoms may be substituted with an aliphatic ring, an aromatic ring, or an alkenyl group, a $C_{3-8}$ cycloalkyl group in which a part of hydrogen atoms may be substituted with an aromatic ring, an alkyl group, or an alkenyl group, and a $C_{6-12}$ aryl group in which a part of hydrogen atoms may be substituted with an aliphatic ring, an alkyl group, or an alkenyl group, are preferable.

When each of $Q^8$ and $Q^9$ is an unsubstituted alkyl group, the alkyl group may be of either linear or branched, and a carbon number thereof is more preferably 1 to 6.

As the $C_{1-12}$ alkyl group in which a part of hydrogen atoms is substituted with an aliphatic ring, an aromatic ring, or an alkenyl group, a $C_{1-4}$ alkyl group having a $C_{3-6}$ cycloalkyl group, and a $C_{1-4}$ alkyl group that is substituted with a phenyl group are more preferable, and a $C_1$ or $C_2$ alkyl group that is substituted with a phenyl group is particularly preferable. Note that the alkyl group substituted with an alkenyl group means one that is an alkenyl group in its entirety but has no unsaturated bond between a first position and a second position, which is, for example, an allyl group, 3-butenyl group, or the like.

As the monovalent hydrocarbon group having a substituent, a hydrocarbon group having one or more of an alkoxy group, an acyl group, an acyloxy group, a cyano group, a dialkylamino group or a chlorine atom is preferable. The carbon number of these alkoxy group, acyl group, acyloxy group and dialkylamino group is preferably 1 to 6.

Each of preferable $Q^8$ and $Q^9$ is a $C_{1-6}$ alkyl group in which a part of hydrogen atoms may be substituted with a cycloalkyl group or a phenyl group.

Each of particularly preferable $Q^8$ and $Q^9$ is a $C_{1-6}$ alkyl group, and concretely, there can be cited, for example, a methyl group, an ethyl group, a propyl group, an isopropyl group, a butyl group, an isobutyl group, a t-butyl group, and the like.

Each of $Q^{10}$ to $Q^{19}$ independently represents a hydrogen atom or a monovalent $C_{1-12}$ hydrocarbon group that may have a substituent. The monovalent $C_{1-12}$ hydrocarbon group that may have a substituent is a hydrocarbon group similar to the above-described $Q^8$ and $Q^9$. As the monovalent $C_{1-12}$ hydrocarbon group that may have a substituent, a $C_{1-6}$ alkyl group having no substituent is preferable.

$Q^{10}$ and $Q^{11}$ are both more preferably a $C_{1-6}$ alkyl group, and are particularly preferably the same alkyl group.

Each of $Q^{12}$ and $Q^{15}$ is preferably a hydrogen atom or a $C_{1-6}$ alkyl group having no substituent. Each of two groups bonded to the same carbon atom ($Q^{13}$ and $Q^{14}$, $Q^{16}$ and $Q^{17}$, $Q^{18}$ and $Q^{19}$) is preferably a hydrogen atom, or a $C_{1-6}$ alkyl group.

As the compound of Formula (M), a compound in which Y is an oxygen atom, and Z is a group (Z1) or group (Z2), and a compound in which Y is a methylene group substituted with $Q^6$ and $Q^7$, and Z is a group (Z1) or group (Z5) are preferable.

As Z when Y is an oxygen atom, the group (Z1) or group (Z2) in which $Q^1$ is a $C_{1-6}$ alkyl group, each of $Q^2$ and $Q^3$ is a hydrogen atom or a $C_{1-6}$ alkyl group, and each of $Q^4$ and $Q^5$ is a hydrogen atom, is more preferable. The group (Z1) or group (Z2) in which $Q^1$ is a $C_{1-6}$ alkyl group, each of $Q^2$ and $Q^3$ is a $C_{1-6}$ alkyl group, and each of $Q^4$ and $Q^5$ is a hydrogen atom, is particularly preferable.

As the compound in which Y is a methylene group substituted with $Q^6$ and $Q^7$, and Z is the group (Z1) or group (Z5), the group (Z1) or group (Z5) in which $Q^1$ is a $C_{1-6}$ alkyl group, each of $Q^2$ and $Q^3$ is a hydrogen atom or a $C_{1-6}$ alkyl group, and each of $Q^4$ to $Q^7$ is a hydrogen atom, is preferable, and the group (Z1) or group (Z5) in which $Q^1$ is a $C_{1-6}$ alkyl group, and each of $Q^2$ to $Q^7$ is a hydrogen atom, is more preferable.

As the compound of Formula (M), the compound in which Y is an oxygen atom, and Z is the group (Z1) or group (Z2) is preferable, and the compound in which Y is an oxygen atom, and Z is the group (Z1) is particularly preferable.

As concrete examples of the UV dye (M), there can be cited compounds of Formulas (M-1) to (M-11) below.

[Chemical Formula 11]

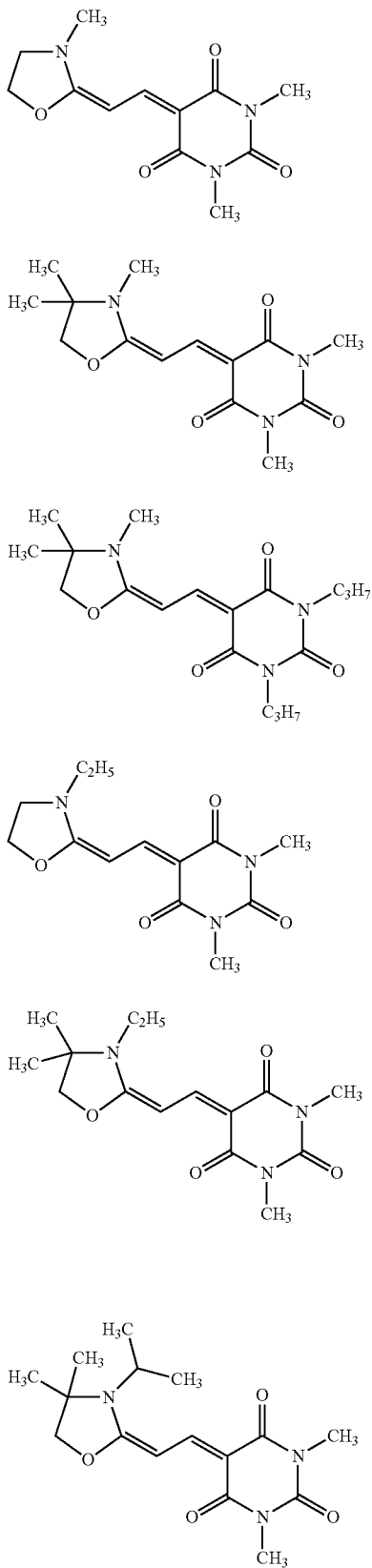

[Chemical Formula 12]

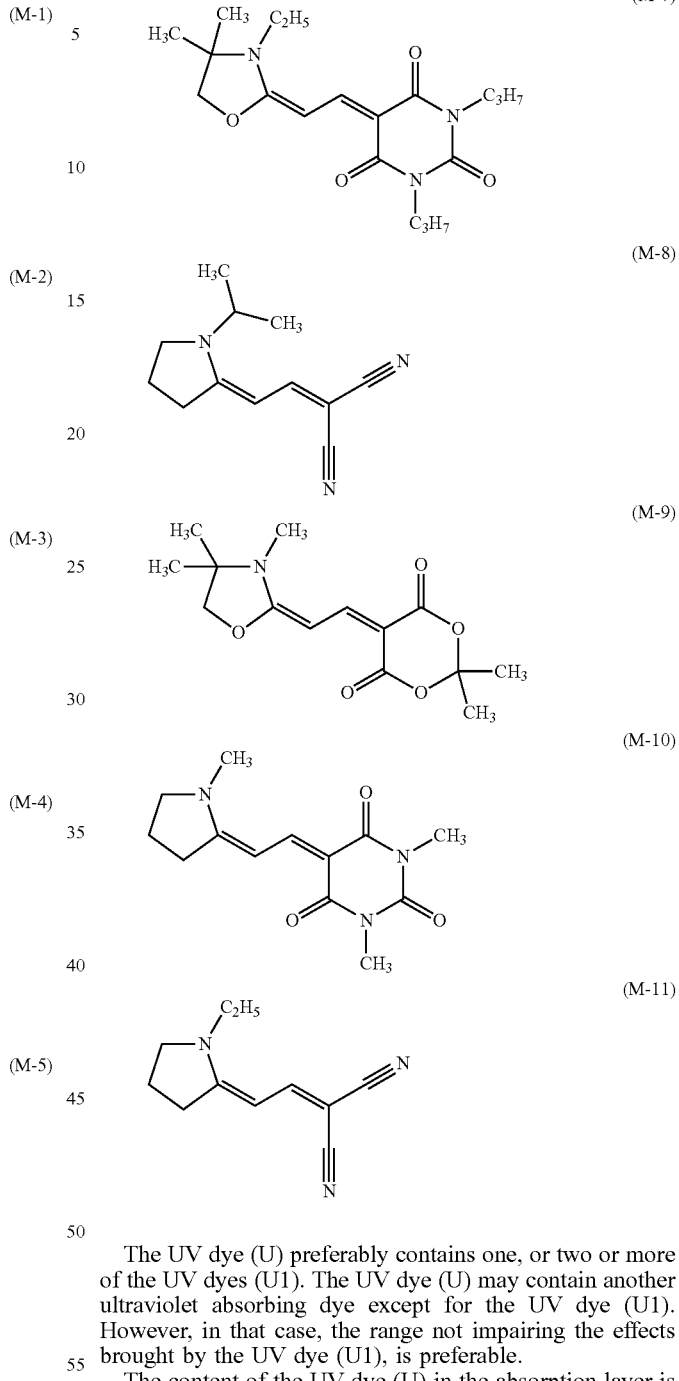

The UV dye (U) preferably contains one, or two or more of the UV dyes (U1). The UV dye (U) may contain another ultraviolet absorbing dye except for the UV dye (U1). However, in that case, the range not impairing the effects brought by the UV dye (U1), is preferable.

The content of the UV dye (U) in the absorption layer is preferably set so that there is a wavelength at which the transmittance becomes 50% in a wavelength of 400 to 425 nm of a spectral transmittance curve at an incident angle of 0° of the present filter. The UV dye (U) is preferably contained by 0.01 to 30 parts by mass relative to 100 parts by mass of the transparent resin in the absorption layer, it is more preferably contained by 0.05 to 25 parts by mass, and it is still more preferably contained by 0.1 to 20 parts by mass.

(Transparent Resin (B))

As the transparent resin (B), there can be cited, for example, an acrylic resin, an epoxy resin, an ene-thiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide-imide resin, a polyolefin resin, a cyclic olefin resin, and a polyester resin. Regarding these resins, one thereof may be used solely, or two or more thereof may be mixed and used.

Among the above-described resins, from the viewpoint of transparency with respect to visible light, solubility of the NIR dye (A) or the NIR dye (A) and the UV dye (U) to the transparent resin (B), heat resistance, and the like, a resin having a high glass transition point (Tg) is preferable as the transparent resin (B). Concretely, it is preferable to employ one or more selected from a polyester resin, a polycarbonate resin, a polyethersulfone resin, a polyarylate resin, a polyimide resin, and an epoxy resin. Further, the transparent resin (B) is more preferably one or more selected from a polyester resin and a polyimide resin. As the polyester resin, a polyethylene terephthalate resin, a polyethylene naphthalate resin, or the like is preferable. Note that the resin with high glass transition point (Tg) generally has low adhesiveness with respect to a layer made of an inorganic material such as a glass or a dielectric multilayer film, but, in the present invention, since the above-described NIR dye (AI) is used, it is possible to secure sufficient adhesiveness also to these layers.

Note that as the transparent resin (B), a commercial product may be used. As the commercial product, there can be cited OGSOL (registered trademark) EA-F5003 (product name, manufactured by Osaka Gas Chemicals Co., Ltd.), polymethylmethacrylate, and polyisobutylmethacrylate (product name, both being manufactured by Tokyo Chemical Industry Co., Ltd.), BR50 (product name, manufactured by Mitsubishi Rayon Co., Ltd.), and the like, as the acrylic resin.

Further, OKP4HT, OKP4, B-OKP2, and OKP-850 (product name, all being manufactured by Osaka Gas Chemicals Co., Ltd.), VYLON (registered trademark) 103 (product name, manufactured by TOYOBO Co., Ltd.), and the like, can be cited as the polyester resin, SUMIKAEXCEL (registered trademark) PES4800 (product name, manufactured by Sumitomo Chemical Co., Ltd.), and the like, can be cited as the polyethersulfone resin, LeXan (registered trademark) ML9103 (product name, manufactured by sabic), EP5000 (product name, manufactured by MITSUBISHI GAS CHEMICAL COMPANY, INC.), SP3810 (product name, manufactured by Teijin Chemicals Ltd.), SP1516 (product name, manufactured by Teijin Chemicals Ltd.), TS2020 (product name, manufactured by Teijin Chemicals Ltd.), xylex (registered trademark) 7507 (product name, manufactured by sabic), and the like, can be cited as the polycarbonate resin, ARTON (registered trademark) (product name, manufactured by JSR Corporation), ZEONEX (registered trademark) (product name, manufactured by ZEON CORPORATION), and the like, can be cited as the cyclic olefin resin, and Neopulim (registered trademark) C3650 (product name, manufactured by MITSUBISHI GAS CHEMICAL COMPANY, INC.), Neopulim (registered trademark) C3630 (product name, manufactured by MITSUBISHI GAS CHEMICAL COMPANY, INC.), and Neopulim (registered trademark) C3450 (product name, manufactured by MITSUBISHI GAS CHEMICAL COMPANY, INC.) (silica may be contained in these polyimide resins), and the like, can be cited as the polyimide resin.

(Other Components)

The absorption layer may further contain, within the range not impairing the effects of the present invention, various arbitrary components which are normally contained in this type of absorption layer. As the arbitrary components, there can be cited, for example, an adhesiveness-imparting agent, a color tone correcting dye, a leveling agent, an antistatic agent, a heat stabilizer, a light stabilizer, an antioxidant, a dispersing agent, a flame retardant, a lubricant, a plasticizer, and the like.

As the adhesiveness-imparting agent, it is suitable to use a silane coupling agent having at least one selected from the group consisting of a vinyl group, an epoxy group, a styryl group, a methacrylic group, an acrylic group, an amino group, an ureido group, a mercapto group, a sulfide group, and an isocyanate group.

The solvent for dissolving or dispersing the NIR dye (A), the UV dye (U), the transparent resin (B), and the like, is not particularly limited as long as it is a dispersion medium capable of stably dispersing these therein or a solvent capable of stably dissolving these therein. Note that in the present specification, the term "solvent" is used as a concept including both of the dispersion medium and the solvent. Regarding the solvent, one thereof can be used solely, or two or more thereof can be mixed and used.

Although depending also on a coating method of a coating liquid, generally, an amount of the solvent is preferably in a range in which a solid content concentration of the transparent resin (B), the NIR dye (A), and the like in the coating liquid becomes 2 to 50 mass % relative to a total amount of the coating liquid, and it is more preferably in a range in which the solid content concentration becomes 5 to 40 mass % relative to the total amount of the coating liquid. When the solid content concentration is too low, coating evenness is likely to occur. On the contrary, when the solid content concentration is too high, a coating appearance is likely to be poor.

The coating liquid can also contain a surface active agent. When the surface active agent is contained, an appearance, particularly voids due to minute bubbles, dents due to adherence of foreign objects or the like, and crawling in a drying process, can be improved. The surface active agent is not particularly limited, and publicly-known ones such as cationic, anionic, or nonionic agents can be arbitrarily used.

For applying the coating liquid, a coating method such as, for example, an immersion coating method, a cast coating method, a spray coating method, a spinner coating method, a bead coating method, a wire bar coating method, a blade coating method, a roller coating method, a curtain coating method, a slit die coater method, a gravure coater method, a slit reverse coater method, a micro gravure method, an inkjet method, or a comma coater method can be used. Other than the above, it is also possible to employ a bar coater method, a screen printing method, a flexographic printing method, or the like.

Note that even when the present filter is provided with the transparent substrate including a glass substrate or the like as a constituent member, the absorption layer formed by applying the above-described coating liquid onto a substrate different from the transparent substrate, for example, a releasable support substrate may be removed from the support substrate and adhered onto the transparent substrate. The releasable support substrate may be in either film form or plate form, and the material is also not limited in particular as long as it possesses releasability. Concretely, it is possible to use a glass plate, a plastic film subjected to release treatment, a stainless steel sheet, or the like.

Further, the absorption layer can be produced in a film form by extrusion molding, depending on the kind of the transparent resin, and furthermore, a plurality of films produced as above may be stacked and integrated by thermocompression, or the like. When the present filter includes the transparent substrate as the constituent member, they are thereafter adhered onto the transparent substrate.

Further, at a time of applying the coating liquid, it is also possible to perform pretreatment on the transparent substrate, and as a pretreatment agent, one of the aforementioned silane coupling agent and the like can be used solely or two or more of the aforementioned silane coupling agent and the like can be mixed and used.

In the present filter, the thickness of the absorption layer is preferably 0.1 to 100 µm. When the absorption layer is formed of a plurality of absorption layers, the total thickness of the respective absorption layers is preferably 0.1 to 100 µm. The thickness of the absorption layer is appropriately set in accordance with an arrangement space or the like. When the thickness is less than 0.1 µm, there is a possibility that a desired optical characteristic cannot be exhibited sufficiently. Further, when the thickness is greater than 100 µm, flatness of the layer decreases, and there is a possibility that in-plane dispersion of absorptance occurs, and cracks and the like are caused in the anti-reflection layer or the like. For this reason, the thickness of the absorption layer is more preferably 0.3 to 50 µm, and still more preferably 0.3 to 10 µm.

[Selected Wavelength Blocking Layer]

The selected wavelength blocking layer preferably has a wavelength selection characteristic to transmit visible light and block light with a wavelength other than the light blocking region of the absorption layer. In this case, the light blocking region of the selected wavelength blocking layer may include a light blocking region in the near-infrared region of the absorption layer.

The selected wavelength blocking layer is formed of a dielectric multilayer film made by alternately stacking a low-refractive index film and a high-refractive index film.

The high-refractive index film preferably has a refractive index of 1.6 or more, more preferably has a refractive index of 2.2 to 2.5, and as the film, there can be cited $Ta_2O_5$, $TiO_2$, and $Nb_2O_5$, for example. Among them, $TiO_2$ is preferable from the points of reproducibility, stability, and the like in film formability, a refractive index, and the like.

Meanwhile, the low-refractive index film preferably has a refractive index of less than 1.6, more preferably has a refractive index of 1.45 or more and less than 1.55, still more preferably has a refractive index of 1.45 to 1.47, and as the film, there can be cited $SiO_2$, $SiO_xN_y$, and the like, for example. $SiO_2$ is preferable from the points of reproducibility, stability, economic efficiency, and the like in film formability.

The dielectric multilayer film exhibits a function of controlling transmitting and blocking of light in a specific wavelength region by utilizing interference of light, and the transmitting and blocking characteristics include incident angle dependence. Generally, regarding the wavelength of light blocked by reflection, a wavelength of obliquely incident light becomes shorter than a wavelength of perpendicularly incident light (incident angle of 0°).

In the present embodiment, the dielectric multilayer film which forms the selected wavelength blocking layer preferably satisfies (iii-1) and (iii-2).

(iii-1) A transmittance of light of a wavelength range of 420 to 695 nm is 90% or more in spectral transmittance curves at incident angles of 0° and 30°, respectively. The higher the transmittance of light with the wavelength of 420 to 695 nm, the more preferable, and the transmittance is more preferably 93% or more, still more preferably 95% or more, and further preferably 97% or more.

(iii-2) A transmittance of light of a wavelength range of $\lambda_b$ nm to 1100 nm is 1% or less in spectral transmittance curves at incident angles of 0° and 30°, respectively (where $\lambda_b$ is a maximum wavelength at which a transmittance of light of a wavelength range of 650 to 800 nm of the absorption layer becomes 1%). The lower the transmittance of light with the wavelength of $\lambda_b$ nm to 1100 nm, the more preferable, and the transmittance is more preferably 0.5% or less.

When the selected wavelength blocking layer satisfies (iii-1) and (iii-2), the present filter can easily obtain a spectral transmittance characteristic satisfying (iv-1) to (iv-6).

Further, the selected wavelength blocking layer preferably causes a steep change of transmittance in a boundary wavelength region between a transmitting light wavelength and a light blocking wavelength. In order to achieve the purpose, a total stacking number of the low-refractive index film and the high-refractive index film of the dielectric multilayer film which forms the selected wavelength blocking layer is preferably 15 or more, more preferably 25 or more, and still more preferably 30 or more. However, when the total stacking number increases, warpage or the like of the dielectric multilayer film occurs, and further, the film thickness of the dielectric multilayer film increases, so that the total stacking number is preferably 100 or less, more preferably 75 or less, and still more preferably 60 or less.

Under the condition where the above-described preferable stacking number is satisfied, the film thickness of the dielectric multilayer film is preferably thin, from the viewpoint of reduction in thickness of the optical filter. The film thickness of the dielectric multilayer film as above is preferably 2 to 10 µm, although depending on the selected wavelength blocking characteristic.

The selected wavelength blocking layer may have a predetermined selected wavelength blocking characteristic by a single layer, namely, only by a configuration of one dielectric multilayer film, or may have a predetermined selected wavelength blocking characteristic by a plurality of layers. When a plurality of layers are provided, for example, they may be provided on one side of the absorption layer, or on both sides of the absorption layer by sandwiching the absorption layer therebetween.

[Anti-Reflection Layer]

As the anti-reflection layer, there can be cited a dielectric multilayer film, an intermediate refractive index medium, a moth-eye structure having a refractive index that gradually changes, and the like. Among them, from the viewpoint of optical efficiency and productivity, the use of dielectric multilayer film is preferable. The dielectric multilayer film used for the anti-reflection layer is obtained by alternately stacking a low-refractive index film and a high-refractive index film, similarly to the dielectric multilayer film used for the selected wavelength blocking layer.

[Transparent Substrate]

The transparent substrate may have a shape of block form, plate form, or film form, and a thickness thereof is, although depending also on the composing material, preferably 0.03 to 5 mm, and more preferably 0.05 to 1 mm from the point of reduction in thickness.

The material of the transparent substrate is not particularly limited as long as the transparent substrate transmits visible light, and it is possible to use a glass, crystal, resin, or the like. The transparent substrate is preferably a glass from the viewpoints of optical characteristic as the optical filter, shape stability related to reliability over a long period of a mechanical property and the like, and the viewpoints of handleability, workability, and the like during manufacturing of the filter.

As resins that can be used for the transparent substrate, there can be cited polyester resins such as polyethylene terephthalate and polybutylene terephthalate, polyolefin resins such as polyethylene, polypropylene, and an ethylene-vinyl acetate copolymer, norbornene resins, acrylic resins such as polyacrylate and polymethyl methacrylate, urethane resins, vinyl chloride resins, fluorocarbon resins, polycarbonate resins, polyvinyl butyral resins, polyvinyl alcohol resins, polyimide resins, and the like.

As glasses that can be used for the transparent substrate, there can be cited an absorption-type glass made by adding CuO or the like to a fluorophosphate-based glass, a phosphate-based glass, or the like (near-infrared absorbing glass substrate), a soda lime glass, a borosilicate glass, a non-alkali glass, a quartz glass, and the like. Note that it is set that "phosphate glass" includes a silicophosphate glass in which a part of the skeleton of the glass is constituted of $SiO_2$.

Further, as crystal materials that can be used for the transparent substrate, there can be cited birefringent crystals such as crystalline quartz, lithium niobate, and sapphire.

Here, concrete composition examples of a glass containing CuO used for the transparent substrate will be described.

(1) A glass containing CuO: 0.5 to 7 parts by mass in outer percentage relative to 100 parts by mass of a base glass containing, in mass %, $P_2O_5$ of 46 to 70%, $AlF_3$ of 0.2 to 20%, LiF+NaF+KF of 0 to 25%, and $MgF_2+CaF_2+SrF_2+BaF_2+PbF_2$ of 1 to 50%, where F is 0.5 to 32%, and O is 26 to 54%.

(2) A glass constituted of, in mass %, $P_2O_5$ of 25 to 60%, $Al_2OF_3$ of 1 to 13%, MgO of 1 to 10%, CaO of 1 to 16%, BaO of 1 to 26%, SrO of 0 to 16%, ZnO of 0 to 16%, $Li_2O$ of 0 to 13%, $Na_2O$ of 0 to 10%, $K_2O$ of 0 to 11%, CuO of 1 to 7%, ΣRO (R=Mg, Ca, Sr, Ba) of 15 to 40%, and ΣR'$_2$O (R'=Li, Na, K) of 3 to 18% (where $O^{2-}$ ions up to 39 mol % amount are substituted with $F^-$ ions).

(3) A glass containing, in mass %, $P_2O_5$ of 5 to 45%, $AlF_3$ of 1 to 35%, RF (R is Li, Na, K) of 0 to 40%, R'F$_2$ (R' is Mg, Ca, Sr, Ba, Pb, Zn) of 10 to 75%, R"F$_m$ (R" is La, Y, Cd, Si, B, Zr, Ta, and m is a number equivalent to the atomic value of R") of 0 to 15% (where up to 70% of the total amount of fluoride can be substituted with an oxide), and CuO of 0.2 to 15%.

(4) A glass containing, in cation %, $P^{5+}$ of 11 to 43%, $Al^{3+}$ of 1 to 29%, R cations (total amount of Mg, Ca, Sr, Ba, Pb, and Zn ions) of 14 to 50%, R' cations (total amount of Li, Na, and K ions) of 0 to 43%, R" cations (total amount of La, Y, Gd, Si, B, Zr, and Ta ions) of 0 to 8%, and $Cu^{2+}$ of 0.5 to 13%, and further containing $F^-$ of 17 to 80% in anion %.

(5) A glass containing, in cation %, $P^{5+}$ of 23 to 41%, $Al^{3+}$ of 4 to 16%, $Li^+$ of 11 to 40%, $Na^+$ of 3 to 13%, $R^{2+}$ (total amount of $Mg^{2+}$, $Ca^{2+}$, $Sr^{2+}$, $Ba^{2+}$, and $Zn^{2+}$) of 12 to 53%, and $Cu^{2+}$ of 2.6 to 4.7%, and further containing, in anion %, $F^-$ of 25 to 48%, and $O^{2-}$ of 52 to 75%.

(6) A glass containing CuO of 0.1 to 5 parts by mass in outer percentage relative to 100 parts by mass of a base glass constituted of, in mass %, $P_2O_5$ of 70 to 85%, $Al_2O_3$ of 8 to 17%, $B_2O_3$ of 1 to 10%, $Li_2O$ of 0 to 3%, $Na_2O$ of 0 to 5%, and $K_2O$ of 0 to 5%, where $Li_2O+Na_2O+K_2O$ is 0.1 to 5%, and $SiO_2$ is 0 to 3%.

When commercial products are exemplified, there can be cited NF-50E, NF-50EX, NF-50T, NF-50TX (product name, manufactured by Asahi Glass Co., Ltd.), or the like for the glass of (1), BG-60, BG-61 (product name, manufactured by Schott AG), or the like for the glass of (2), and CD 5000 (product name, manufactured by HOYA Corporation), or the like for the glass of (5).

The above-described CuO-containing glasses may further contain a metal oxide. When, for example, one, or two or more of $Fe_2O_3$, $MoO_3$, $WO_3$, $CeO_2$, $Sb_2O_3$, $V_2O_5$, and the like is/are contained as the metal oxide, the CuO-containing glasses have an ultraviolet absorption characteristic. The content of these metal oxides is preferably set such that at least one selected from the group consisting of $Fe_2O_3$, $MoO_3$, $WO_3$, and $CeO_2$ is contained in which $Fe_2O_3$ is 0.6 to 5 parts by mass, $MoO_3$ is 0.5 to 5 parts by mass, $WO_3$ is 1 to 6 parts by mass, and $CeO_2$ is 2.5 to 6 parts by mass, or two of $Fe_2O_3$ and $Sb_2O_3$ are contained by $Fe_2O_3$ of 0.6 to 5 parts by mass+$Sb_2O_3$ of 0.1 to 5 parts by mass, or two of $V_2O_5$ and $CeO_2$ are contained by $V_2O_5$ of 0.01 to 0.5 parts by mass+$CeO_2$ of 1 to 6 parts by mass, relative to 100 parts by mass of the above-described CuO-containing glass.

Note that when the present filter includes a glass or an absorption-type glass as the transparent substrate 14, it is also possible to provide a not-illustrated dielectric layer between the glass or the absorption-type glass (transparent substrate 14) and the absorption layer 11. The dielectric layer is a layer formed of a dielectric material, and a thickness thereof is preferably 30 nm or more. When the dielectric layer is provided, it is possible to improve the durability of the absorption layer 11 in the present filter. The thickness of the dielectric layer is more preferably 100 nm or more, and still more preferably 200 nm or more. Although there is no particular upper limit for the thickness of the dielectric layer, from the viewpoint of easiness of designing and production, the thickness of the dielectric layer is preferably 2000 nm or less, and more preferably 1000 nm or less.

When the transparent substrate made of a glass contains, for example, alkaline atoms such as Na atoms and K atoms, and these alkaline atoms diffuse through the absorption layer 11, which may deteriorate the optical characteristic and weather resistance of the absorption layer 11, the dielectric layer functions as an alkali barrier film, which enables to improve the durability of the present filter. In the above-described case, examples of the dielectric layer preferably include $SiO_2$, $SiO_x$, $Al_2O_3$, and so on.

The present filter may also further have an adhesive film between the transparent substrate 14 and the absorption layer 11. As the adhesive film, it is possible to select one made of at least one material selected from $MgF_2$, $CaF_2$, $LaF_3$, $NdF_3$, $CeF_3$, $Na_5Al_3F_{14}$, $Na_3AlF_6$, $AlF_3$, $BaF_2$, and $YF_3$. As described above, it is also possible to provide, between the transparent substrate made of the glass and the absorption layer 11, for example, the above-described dielectric layer (alkali barrier film) or the adhesive film, or both of the dielectric layer and the adhesive film. Note that in the present specification, when the aforementioned dielectric layer and/or the adhesive film are/is provided between the glass or the near-infrared absorbing glass (absorption-type glass) and the absorption layer 11 as described above, one including the dielectric layer and/or the adhesive film on the glass or the near-infrared absorbing glass, is also set to be dealt as "transparent substrate."

Regarding the optical characteristic of the transparent substrate, it is preferable to be able to possess the optical characteristic of the present invention as the NIR filter obtained by stacking the aforementioned absorption layer, the aforementioned selected wavelength blocking layer, and the like on the transparent substrate.

When the aforementioned absorption layer is stacked on a main surface of the transparent substrate, surface treatment with a silane coupling agent may be performed on the surface to be stacked. By using the transparent substrate after being subjected to the surface treatment with the silane coupling agent, adhesiveness with the absorption layer can be increased. As the silane coupling agent, for example, the same one as one used for the absorption layer described above can be used.

The present filter can be used as a NIR filter of an imaging device such as a digital still camera, an automatic exposure meter or the like, a NIR filter for PDP, and the like. The present filter is used preferably in a solid-state imaging device such as a digital still camera.

EXAMPLE

Next, the present invention will be described more concretely based on examples. Example 5-1 to Example 5-4, Example 5-6 to Example 5-9, Example 6-1 and Example 6-2, and Example 7-1 to Example 7-3 are examples of an optical filter according to the present invention.

<Synthesis of Dye>

NIR Dyes (A1-1) to (A1-13) to be used in examples (described as dyes for examples) and NIR dyes (A2) to (A8) for comparison (described as dyes for comparison) were synthesized. The NIR dyes (A1-1) to (A1-13) are the dyes described in Table 1, and the NIR dyes (A2) to (A8) are NIR dyes of Formulas (A2) to (A8).

[Chemical Formula 13]

(A2)

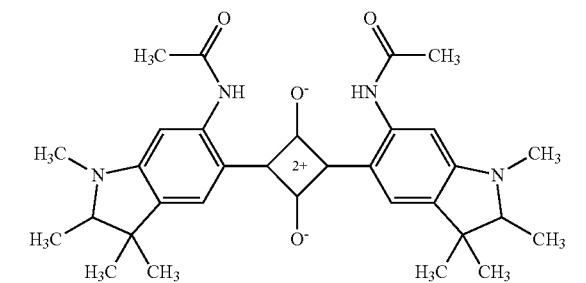

(A3)

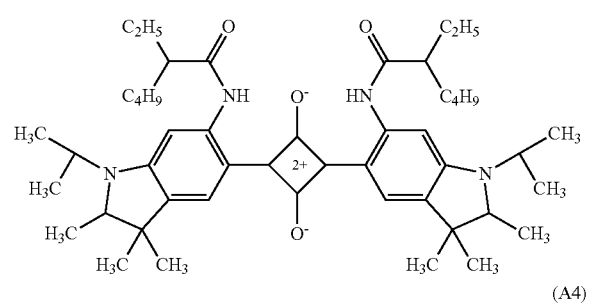

(A4)

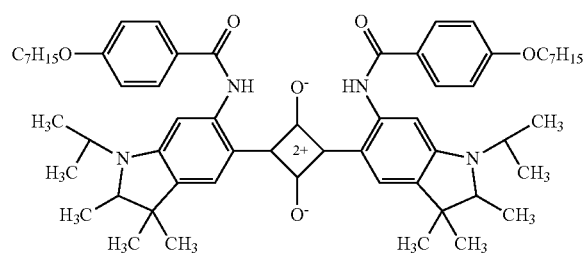

[Chemical Formula 14]

(A5)

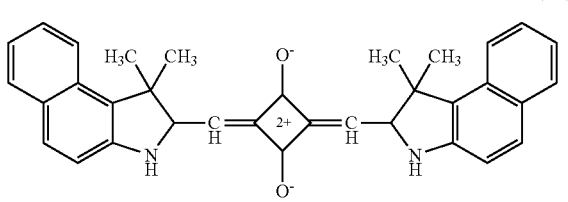

(A6)

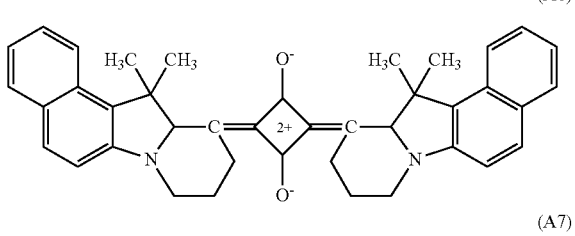

(A7)

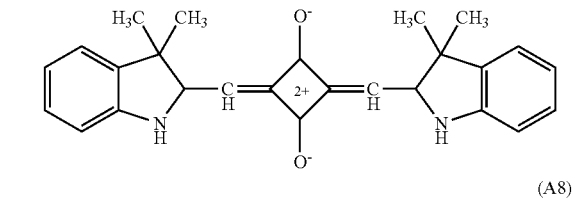

(A8)

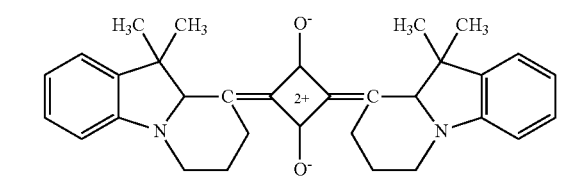

[Production of NIR Dye (A1-6)]

Hereinafter, a production example of the NIR dye (A1-6) will be explained concretely by using Reaction Formula (F1). Note that in the following explanation, although description is not made on $R^1$ to $R^4$ in raw material components ((a), (g)) and intermediate products ((b) to (h)), $R^1$ is an isopropyl group, $R^2$ is an n-propyl group, and each of $R^3$ and $R^4$ is a hydrogen atom.

In the production of the NIR dye (A1-6), a compound (a) in Reaction Formula (F1) was obtained from Tokyo Chemical Industry Co., Ltd., and used as a starting material.

(Production of Compound (b))

To a 1 L eggplant flask, 31.50 g (0.197 mol) of the compound (a), and 134.06 g (0.79 mol) of isopropyl iodide were added to cause a reaction for 48 hours at 110° C. A red precipitate precipitated to be substantially a solid after a liquid of the isopropyl iodide disappeared in a reaction container. The temperature was returned to room temperature, and hexane was added to filter the precipitate. A filtered material was washed again with hexane to be filtered. As a result of this, a compound (b) (63.9 g, 0.19 mol, yield: 98.0%) was obtained.

(Production of Compound (c))

To a 1 L eggplant flask, 63.9 g (0.19 mol) of the compound (b) and 200 ml of water were added, and then a sodium hydroxide aqueous solution (NaOH 40 g (1.0 mol)+ water 200 ml) was dropped. After the addition, a reaction was brought about for four hours at room temperature, and then extraction was performed with dichloromethane and water, and from a dichloromethane layer, a solvent was removed using an evaporator. A condensed organic layer was refined by a column chromatography method. As a result of this, a liquid compound (c) (33.6 g, 0.17 mol, yield: 86.7%) was obtained.

(Production of Compound (d))

To a 1 L eggplant flask, 33.6 g (0.17 mol) of the compound (c) and 700 ml of methanol were added. It was cooled to 0° C., and sodium borohydride (14.76 g, 0.39 mol) was added. After the addition, the temperature was returned to room temperature, and a reaction was brought about for four hours. After the reaction was finished, water was added, and thereafter, extraction was performed with ethyl acetate and water. After the extraction, from an obtained organic layer, a solvent was removed using an evaporator. The condensed organic layer was refined by a column chromatography method. As a result of this, a liquid compound (d) (26.68 g, 0.13 mol, yield: 79.0%) was obtained.

(Production of Compound (e))

To a 1 L eggplant flask, 26.68 g (0.13 mol) of the compound (d) was added, and under an ice bath at 0° C., 80 g (0.81 mol) of concentrated sulfuric acid was dropped. After the concentrated sulfuric acid was dropped, stirring was performed for 30 minutes. Thereafter, a mixed solution of 19.19 g of 60% concentrated nitric acid and 60 g of concentrated sulfuric acid was dropped under an ice bath. After the dropping was finished, the reaction temperature was gradually returned to room temperature, and a reaction was brought about for 15 hours at the same temperature. After the reaction was finished, it was cooled to 0° C. again, and 300 ml of water was added. Further, a 40 mass % of sodium hydroxide aqueous solution was dropped until the reaction solution was neutralized. Thereafter, extraction was performed with dichloromethane. An obtained organic layer was dried with magnesium sulfate, and a solvent was removed using an evaporator. The condensed organic layer was refined by a column chromatography method. As a result of this, a liquid compound (e) (26.0 g, 0.10 mol, yield: 80.0%) was obtained.

(Production of Compound (f))

In a 2 L eggplant flask, 26.0 (0.10 mol) of the compound (e) and 400 ml of THF were put, and then under an ice bath, 8 g of palladium-carbon and 400 ml of ethanol were added in order, and further, 93 g (1.48 mol) of ammonium formate was added. Thereafter, a reaction system was opened and stirring was performed under an air atmosphere at room temperature for 12 hours. After a reaction was finished, water was added. The reaction solution was filtered, the filtrate was subjected to liquid separation with dichloromethane-water, and then an organic layer was condensed using an evaporator. The condensed organic layer was refined by a column chromatography. As a result of this, an oily compound (f) (16.5 g, 0.075 mol, yield: 72.0%) was obtained.

(Production of Compound (h))

To a 2 L eggplant flask, 4.0 g (0.018 mol) of the compound (f), 90 ml of dichloromethane, and 2.84 g (0.22 mol) of diisopropyl ethyl amine were added, and then 2.68 g (0.022 mol) of chloroformic acid ester having a substituent $R^2$ was dropped. After the dropping was finished, the temperature was returned to room temperature, and a reaction was brought about for two hours. After the reaction was finished, water was added, and extraction was performed with dichloromethane. An obtained organic layer was dried with sodium sulfate, a solvent was removed using an evaporator, and then the condensed organic layer was refined by a column chromatography method. As a result of this, a solid compound (h) (3.2 g, 0.011 mol, yield: 57%) was obtained.

(Production of NIR Dye (A1-6))

A Dean-Stark pipe was attached to a 1 L eggplant flask, 2.5 g (0.008 mol) of the compound (h), 0.47 g (0.0041 mol) of squaric acid, 4.68 g (0.032 mol) of ethyl orthoformate, and 100 ml of ethanol were added thereto, and heating and stirring were performed for eight hours at 90° C. After a reaction was finished, a solvent was removed using an evaporator, and then purification was performed by a column chromatography method. As a result of this, a NIR dye (A1-6) (2.3 g, 0.0033 mol, yield: 81%) was obtained.

[Production of NIR Dyes (A1-1), (A1-3) to (A1-5)]

NIR dyes (A1-1), and (A1-3) to (A1-5) were produced similarly except that iodomethane was used in place of the isopropyl iodide, and $R^2$ of the chloroformic acid ester (g) having the substituent $R^2$ each were set to $R^2$ illustrated in Table 1 in the production of the NIR dye (A1-6).

[Production of NIR Dye (A1-2)]

A NIR dye (A1-2) was produced similarly except that iodomethane was used in place of the isopropyl iodide in the production of the NIR dye (A1-6).

[Production of NIR Dyes (A1-7) to (A1-9)]

NIR dyes (A1-7) to (A1-9) were produced similarly except that $R^2$ of the chloroformic acid ester (g) having the substituent $R^2$ each were set to $R^2$ illustrated in Table 1 in the production of the NIR dye (A1-6).

[Production of NIR Dye (A1-12)]

In the production of a NIR dye (A1-12), the compound (a) in Reaction Formula (F1) (where each of $R^3$ and $R^4$ is a hydrogen atom) was used as a starting material. Further, the compound (f) in Reaction Formula (F1) (where $R^1$ is 1, 1-dimethylpropyl group, and each of $R^3$ and $R^4$ is a hydrogen atom) was produced via a path indicated in Reaction Formula (F2), and from this compound (f), a NIR dye (A1-10) was produced via the compound (h) (where $R^1$ is —$(CH_3)_2CC_2H_5$, $R^2$ is —$CH_2CH_2CH_3$ (n-$C_3H_7$), and each of $R^3$ and $R^4$ is a hydrogen atom), similarly to the case of the NIR dye (A1-6). Note that in Reaction Formula (F2-1), TSOH represents para-toluenesulfonic acid. Hereinafter, TSOH is used by the same meaning as above in the present specification.

(Production of Compound (i))

To a 1 L eggplant flask, 50.0 g (0.31 mol) of the compound (a) and 60.0 g (0.35 mol) of para-toluenesulfonic acid were added, and next, 114.0 g (0.37 mol) of sodium borohydride was added at 0° C. A reaction was brought about for two hours while performing stirring with a mechanical stirrer, cooling was performed again to 0° C., water was dropped, and the reaction was finished. After the reaction was finished, extraction was performed with dichloromethane and water, and from a dichloromethane layer, a solvent was removed using an evaporator, and a condensed organic layer was refined by a column chromatography method. As a result of this, a solid compound (i) (46.0 g, 0.29 mol, yield: 91.0%) was obtained.

(Production of Compound (k))

To a 1 L eggplant flask, 45.7 g (0.28 mol) of the compound (i), 54.9 g (0.43 mol) of diisopropylethylamine, 40.0 g (0.29 mol) of a compound (j), 5.0 g (0.026 mol) of copper iodide, and 600 ml of THF were added. A reaction was brought about for 13 hours at 50° C., 5.0 g (0.026 mol) of copper iodide was further added, and a reaction was brought about for five hours. After the reaction was finished, extraction was performed with dichloromethane and water, and from a dichloromethane layer, a solvent was removed using an evaporator, and a condensed organic layer was refined by a column chromatography method. As a result of this, a compound (k) (31.0 g, 0.13 mol, yield: 45.0%) was obtained.

Note that the compound (j) was generated from a compound (l) via a reaction path indicated in Reaction Formula (F2-2). Specifically, to a 1 L eggplant flask, 75.0 g (0.76 mol) of the compound (l), 90.0 g (0.88 mol) of acetic anhydride, 100.0 g (0.99 mol) of triethylamine, and 1 L of dichloromethane were added, and a reaction was brought about for 24 hours at 40° C. After the reaction was finished, liquid separation was performed with a sodium hydrogen carbonate aqueous solution and water, a solvent was removed using an evaporator, and then purification was carried out through distillation. As a result of this, a solid compound (j) (46.0 g, 0.29 mol, yield: 91.0%) was obtained.

(Production of Compound (f))

In a 1 L eggplant flask, 30.0 g (0.12 mol) of the compound (k), 5 g of palladium-carbon, and 500 ml of THF were put, and hydrogen was added under atmospheric pressure to cause a reaction for eight hours. After the reaction was finished, a reaction solution was filtered to remove the palladium-carbon, and further, a solvent was removed by using an evaporator, and a residue was refined by a column chromatography. As a result of this, a compound (f) (25.0 g, 0.10 mol, yield: 82.0%) was obtained.

(Production of NIR Dye (A1-12))

A NIR dye (A1-12) was produced similarly to the case of the NIR dye (A1-6) except that the compound (f) obtained as above was used, and $R^2$ of the chloroformic acid ester (g) having the substituent $R^2$ was set to $R^2$ illustrated in Table 1.

[Chemical Formula 15]

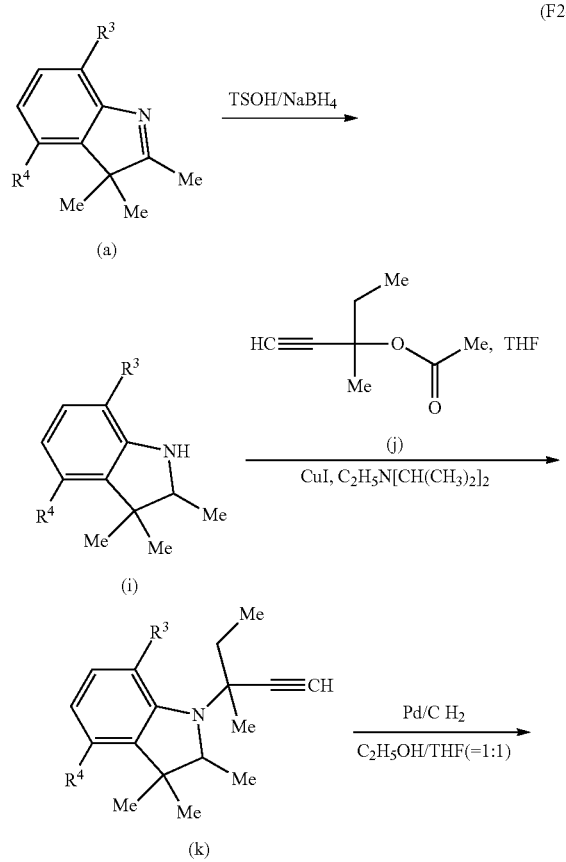

[Chemical Formula 16]

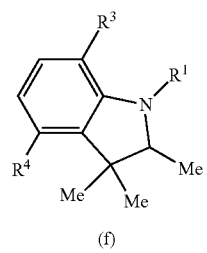

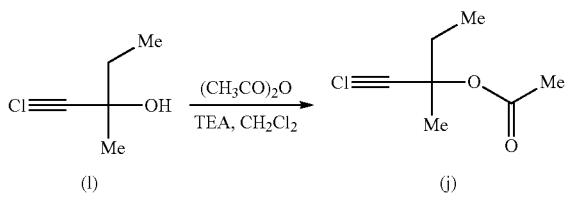

[Production of NIR Dye (A1-13)]

A NIR dye (A1-13) was produced similarly except that $R^2$ of the chloroformic acid ester (g) having the substituent $R^2$ was set to $R^2$ illustrated in Table 1 in the production of the NIR dye (A1-12).

[Production of NIR Dye (A1-10)]

A dye (A1-10) was produced similarly except that a compound (j') to be represented below was used in place of the compound (j) in the production of the NIR dye (A1-12).

Note that the compound (j') was produced similarly except that a compound (l') was used in place of the compound (l) as a starting material in the production of the compound (j).

[Chemical Formula 17]

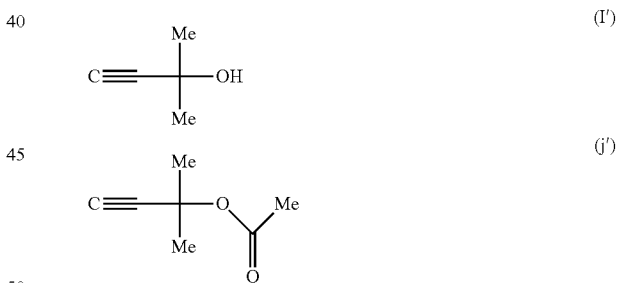

[Production of NIR Dye (A1-11)]

A NIR dye (A1-11) was produced similarly except that $R^2$ of the chloroformic acid ester (g) having the substituent $R^2$ was set to $R^2$ illustrated in Table 1 in the production of the NIR dye (A1-10).

Note that regarding the NIR dyes for comparison (A2) to (A8), the NIR dyes (A2) to (A4) were produced by the method described in International Publication Pamphlet No. WO14/088063, and the NIR dyes (A5) to (A8) were produced by the method described in WO11/086785.

<Evaluation of NIR Dye>

(1) Absorption Characteristic of NIR Dye in Dichloromethane

The obtained NIR dyes were each dissolved in dichloromethane, and an ultraviolet-visible spectrophotometer (manufactured by Hitachi High Technologies Co., Ltd., U-4100 type) was used to measure each spectral transmittance curve, from which a maximum absorption wavelength $\lambda_{max}$, a wavelength $\lambda_{80}$ at which the transmittance becomes 80% on a shorter wavelength side than the maximum absorption wavelength with the transmittance at the maximum absorption wavelength set to 10%, a difference between the maximum absorption wavelength $\lambda_{max}$ and the wavelength $\lambda_{80}$ ($\lambda_{max}-\lambda_{80}$), a maximum absorption constant $\varepsilon_A$ in light of a wavelength range of 430 to 550 nm, a maximum absorption constant $\varepsilon_B$ in light of a wavelength range of 670 to 730 nm, and a ratio of these ($\varepsilon_B/\varepsilon_A$) were calculated. Results are illustrated in Table 3. Note that the U-4100 type was used for the measurement of spectral transmittance curves in each of the following examples.

TABLE 3

|  | Dye Abbreviation | $\lambda_{max}$ [nm] | $\varepsilon_A$ [M$^{-1}$cm$^{-1}$] | $\varepsilon_B$ [M$^{-1}$cm$^{-1}$] | $\varepsilon_B/\varepsilon_A$ | $\lambda_{80}$ [nm] | $\lambda_{max} - \lambda_{80}$ [nm] |
|---|---|---|---|---|---|---|---|
| Dye for example | A1-1 | 691 | 0.014 | 1 | 71.1 | 632 | 59 |
|  | A1-2 | 691 | 0.017 | 1 | 59.0 | 633 | 58 |
|  | A1-3 | 691 | 0.013 | 1 | 77.5 | 633 | 58 |
|  | A1-4 | 690 | 0.019 | 1 | 53.5 | 632 | 58 |
|  | A1-5 | 693 | 0.016 | 1 | 63.9 | 636 | 57 |
|  | A1-6 | 697 | 0.016 | 1 | 63.9 | 647 | 50 |
|  | A1-7 | 697 | 0.016 | 1 | 61.8 | 647 | 50 |
|  | A1-8 | 697 | 0.017 | 1 | 60.2 | 647 | 50 |
|  | A1-9 | 700 | 0.013 | 1 | 75.7 | 651 | 49 |
|  | A1-10 | 705 | 0.018 | 1 | 55.5 | 658 | 47 |
|  | A1-11 | 705 | 0.016 | 1 | 61.3 | 658 | 47 |
|  | A1-12 | 707 | 0.017 | 1 | 59.7 | 656 | 51 |
|  | A1-13 | 707 | 0.019 | 1 | 51.8 | 659 | 48 |
| Dye for comparison | A2 | 698 | 0.021 | 1 | 48.5 | 640 | 58 |
|  | A3 | 706 | 0.020 | 1 | 49.1 | 656 | 50 |
|  | A4 | 710 | 0.029 | 1 | 34.7 | 659 | 51 |
|  | A5 | 683 | 0.011 | 1 | 93.8 | 604 | 79 |
|  | A6 | 706 | 0.021 | 1 | 47.3 | 632 | 74 |
|  | A7 | 632 | 0.027 | 1 | 37.3 | 572 | 60 |
|  | A8 | 676 | 0.009 | 1 | 106.3 | 611 | 65 |

As illustrated in Table 3, each of the NIR dyes (A1-1) to (A1-13) satisfies (i-1) to (i-3). On the other hand, the NIR dyes (A2) to (A4) do not satisfy (i-2), and the NIR dye (A5) does not satisfy (i-3). Further, the NIR dye (A7) satisfies neither (i-1) nor (i-2), the NIR dye (A8) does not satisfy (i-3), and the NIR dye (A6) satisfies neither (i-2) nor (i-3).

Absorption Characteristic of NIR Dye in Transparent Resin

Example 1-1 to Example 1-12

The NIR dyes illustrated in Table 4, among the obtained NIR dyes, were each mixed with a cyclohexanone solution having a polyimide resin (Neopulim (registered trademark) C3450), and the resultant solutions were each stirred and dissolved at room temperature, to thereby obtain coating liquids. Note that in Example 1-11, the used NIR dye (A2) was not dissolved in the resin solution, and thus it was not possible to prepare a coating liquid.

The obtained coating liquids were each applied onto a glass (non-alkali glass; product name: AN100 manufactured by Asahi Glass Co., Ltd.) substrate having a thickness of 0.3 mm by a spin coating method, and heated and dried to form absorption layers having a thickness of 0.9 μm to 1.1 μm, and NIR filters (Example 1-1 to Example 1-10, Example 1-12) each formed of the transparent substrate and the absorption layer were obtained.

Example 2-1 to Example 2-7

The dyes illustrated in Table 5, among the obtained NIR dyes, were each mixed with a cyclohexanone solution and an NMP solution prepared by dissolving a polyimide resin (C3630) in a mixed solvent (cyclohexanone+NMP), and the resultant solutions were each stirred and dissolved at room temperature, to thereby obtain coating liquids. Note that in Example 2-6, the used NIR dye (A2) was not dissolved in the resin solution, and thus it was not possible to prepare a coating liquid.

The obtained coating liquids were each applied onto a glass (AN100) substrate having a thickness of 0.3 mm by a spin coating method, and heated and dried to form absorption layers having a thickness of 0.9 to 1.2 μm, and NIR filters (Example 2-1 to Example 2-5, Example 2-7) were obtained.

Example 3-1 to Example 3-9

The NIR dyes illustrated in Table 6, among the obtained dyes, were each mixed with a cyclohexanone solution having a polyethersulfone resin (SUMIKAEXCEL (registered trademark) PES4800), and the resultant solutions were each stirred and dissolved at room temperature, to thereby obtain coating liquids. Note that in Example 3-9, the used NIR dye (A2) was not dissolved in the resin solution, and thus it was not possible to prepare a coating liquid.

The obtained coating liquids were each applied onto a glass (AN100) substrate having a thickness of 0.3 mm by a spin coating method, and heated and dried to form absorption layers having a thickness of 0.9 to 1.0 μm, and NIR filters (Example 3-1 to Example 3-8) were obtained.

Example 4-1 to Example 4-11

The dyes illustrated in Table 7, among the obtained NIR dyes, were each mixed with a cyclohexanone solution having a polyester resin (OKP850), and the resultant solutions were each stirred and dissolved at room temperature, to thereby obtain coating liquids. Note that in Example 4-11, the used NIR dye (A2) was not dissolved in the resin solution, and thus it was not possible to prepare a coating liquid.

The obtained coating liquids were each applied onto a glass (AN100) substrate having a thickness of 0.3 mm by a spin coating method, and heated and dried to form absorption layers having a thickness of 0.9 to 1.0 μm, and NIR filters (Example 4-1 to Example 4-10) were obtained.

Regarding each of the produced NIR filters, a spectral transmittance curve was measured. From measurement results, a maximum absorption wavelength $\lambda_{Pmax}$, a minimum transmittance of light of a wavelength range of 430 to 550 nm, an average transmittance of light of a wavelength range of 430 to 480 nm, an absorption width with which the transmittance of light of a wavelength range of 690 to 730 nm becomes 1% or less (difference between the longest wavelength $\lambda_b$ at which the transmittance becomes 1% or less and the shortest wavelength $\lambda_a$ at which the transmittance becomes 1% or less ($\lambda_b-\lambda_a$); described as an absorption width), a wavelength $\lambda_{P80}$ at which the transmittance becomes 80% on a shorter wavelength side than the maximum absorption wavelength with the transmittance at the maximum absorption wavelength $\lambda_{Pmax}$ set to 10%, and a difference between the maximum absorption wavelength $\lambda_{Pmax}$ and the wavelength $\lambda_{P80}$ ($\lambda_{Pmax}-\lambda_{P80}$), regarding the absorption layer, were calculated. Results are illustrated in Tables 4 to 7 together with each film thickness of the absorption layers and each ratio of the NIR dye in the absorption layer to the resin.

Note that the values illustrated in Tables 4 to 7 are values obtained by subtracting the transmittance of the glass substrate and the like from the spectral transmittance curves of the NIR filters. Concretely, values are made by subtracting absorption of the glass substrate and effects of reflections on the interface between the glass substrate and the absorption layer and the interface between the glass substrate and the air, and calculating reflection on the interface between the absorption layer and the air.

TABLE 4

| | Dye abbreviation | Resin | Film thickness [μm] | Amount of dye relative to 100 parts by mass of resin [part by mass] | $\lambda_{Pmax}$ [nm] | Minimum transmittance of 430 nm to 550 nm [%] | Absorption width [nm] | $\lambda_{P80}$ [nm] | $\lambda_{Pmax} - \lambda_{P80}$ [nm] | Average transmittance of 430 nm to 480 nm [%] |
|---|---|---|---|---|---|---|---|---|---|---|
| Example 1-1 | A1-2 | Neopulim ® | 0.9 | 9.41 | 701 | 80.8 | 30 | 592 | 109 | 90.3 |
| Example 1-2 | A1-3 | C3450 | 0.9 | 9.97 | 701 | 80.9 | 30 | 592 | 109 | 90.4 |
| Example 1-3 | A1-4 | (polyimide | 0.9 | 11.13 | 702 | 79.9 | 30 | 594 | 108 | 90.0 |
| Example 1-4 | A1-6 | resin) | 0.9 | 9.07 | 707 | 80.6 | 30 | 607 | 100 | 90.4 |
| Example 1-5 | A1-7 | | 0.9 | 9.92 | 707 | 80.1 | 30 | 607 | 100 | 90.3 |
| Example 1-6 | A1-8 | | 0.9 | 9.02 | 708 | 80.6 | 30 | 606 | 102 | 90.2 |
| Example 1-7 | A1-10 | | 1.1 | 8.95 | 714 | 81.0 | 30 | 622 | 92 | 89.0 |
| Example 1-8 | A1-11 | | 1.1 | 9.70 | 714 | 81.1 | 30 | 622 | 92 | 88.8 |
| Example 1-9 | A1-12 | | 1.1 | 9.38 | 716 | 81.2 | 30 | 623 | 93 | 88.4 |
| Example 1-10 | A1-13 | | 1.1 | 10.27 | 716 | 80.0 | 30 | 624 | 92 | 87.5 |
| Example 1-11 | A2 | | — | — | — | — | — | — | — | — |
| Example 1-12 | A3 | | 0.9 | 9.78 | 716 | 79.3 | 30 | 616 | 100 | 89.7 |

As illustrated in Table 4, among Examples using the polyimide resin (C3450), Example 1-1 to Example 1-10 each had the maximum absorption wavelength $\lambda_{Pmax}$ positioned in the wavelength of 701 to 716 nm, the average transmittance of light with the wavelength of 430 to 480 nm of 87% or more, and $\lambda_{Pmax}-\lambda_{P80}$ of 109 nm or less. This indicates that the examples containing the squarylium-based dye of Formula (AI) can maintain the transmittance of light with the wavelength of 600 to 700 nm to be high, and further, the transmittance of light in the visible region with the wavelength of 430 to 480 nm is high, and the absorption curve in the vicinity of a boundary between the visible region and the near-infrared region is steep.

TABLE 5

| | Dye abbreviation | Resin | Film thickness [μm] | Amount of dye relative to 100 parts by mass of resin [part by mass] | $\lambda_{Pmax}$ [nm] | Minimum transmittance of 430 nm to 550 nm [%] | Absorption width [nm] | $\lambda_{P80}$ [nm] | $\lambda_{Pmax} - \lambda_{P80}$ [nm] | Average transmittance of 430 nm to 480 nm [%] |
|---|---|---|---|---|---|---|---|---|---|---|
| Example 2-1 | A1-6 | Neopulim ® | 0.9 | 9.49 | 707 | 82.5 | 30 | 607 | 100 | 90.7 |
| Example 2-2 | A1-7 | C3630 | 0.9 | 10.21 | 706 | 82.3 | 30 | 607 | 99 | 90.5 |
| Example 2-3 | A1-8 | (polyimide | 0.9 | 9.65 | 705 | 82.2 | 30 | 606 | 99 | 90.3 |
| Example 2-4 | A1-12 | resin) | 1.2 | 8.67 | 716 | 80.0 | 30 | 623 | 93 | 88.9 |
| Example 2-5 | A1-13 | | 1.2 | 8.14 | 716 | 81.7 | 30 | 624 | 92 | 90.0 |
| Example 2-6 | A2 | | — | — | — | — | — | — | — | — |
| Example 2-7 | A3 | | 1.0 | 8.66 | 716 | 79.3 | 30 | 616 | 100 | 89.7 |

As illustrated in Table 5, among Examples using the polyimide resin (C3630), Example 2-1 to Example 2-5 each had the maximum absorption wavelength $\lambda_{Pmax}$ positioned in the wavelength of 705 to 716 nm, the average transmittance of light with the wavelength of 430 to 480 nm of 87% or more, and $\lambda_{Pmax}-\lambda_{P80}$ of 100 nm or less. This indicates that the examples containing the squarylium-based dye of Formula (AI) can maintain the transmittance of light with the wavelength of 600 to 700 nm to be high, and further, the transmittance of light in the visible region with the wavelength of 430 to 480 nm is high, and the absorption curve in the vicinity of a boundary between the visible region and the near-infrared region is steep.

of 87% or more, and $\lambda_{Pmax}-\lambda_{P80}$ of 105 nm or less. This indicates that the examples containing the squarylium-based dye of Formula (AI) can maintain the transmittance of light with the wavelength of 600 to 700 nm to be high, and further, the transmittance of light in the visible region with the wavelength of 430 to 480 nm is high, and the absorption curve in the vicinity of a boundary between the visible region and the near-infrared region is steep.

(3) Solubility of NIR Dye

Regarding the dyes for examples among the obtained NIR dyes, solubility to a resin solution was evaluated.

In a solubility test, as resin solutions, there were used three solutions each having a resin concentration of 12.5

TABLE 6

| | Dye abbreviation | Resin | Film thickness [μm] | Amount of dye relative to 100 parts by mass of resin [part by mass] | $\lambda_{Pmax}$ [nm] | Minimum transmittance of 430 nm to 550 nm [%] | Absorption width [nm] | $\lambda_{P80}$ [nm] | $\lambda_{Pmax} - \lambda_{P80}$ [nm] | Average transmittance of 430 nm to 480 nm [%] |
|---|---|---|---|---|---|---|---|---|---|---|
| Example 3-1 | A1-3 | SUMIKA | 0.9 | 9.42 | 702 | 80.7 | 30 | 588 | 114 | 90.1 |
| Example 3-2 | A1-4 | EXCEL ® | 0.9 | 10.91 | 702 | 80.3 | 30 | 590 | 112 | 90.0 |
| Example 3-3 | A1-6 | PES4800 | 1.0 | 8.27 | 708 | 81.3 | 30 | 606 | 102 | 90.0 |
| Example 3-4 | A1-7 | (polyethersulfone) | 1.0 | 8.88 | 707 | 82.0 | 30 | 607 | 100 | 90.3 |
| Example 3-5 | A1-10 | resin | 0.9 | 8.56 | 714 | 80.4 | 30 | 620 | 94 | 89.3 |
| Example 3-6 | A1-11 | | 0.9 | 9.15 | 715 | 80.9 | 30 | 620 | 95 | 89.2 |
| Example 3-7 | A1-12 | | 0.9 | 9.35 | 716 | 81.1 | 32 | 621 | 95 | 88.8 |
| Example 3-8 | A1-13 | | 0.9 | 9.88 | 717 | 80.2 | 32 | 622 | 95 | 88.1 |
| Example 3-9 | A2 | | — | — | — | — | — | — | — | — |

As illustrated in Table 6, among Examples using the polyethersulfone resin (SUMIKAEXCEL (registered trademark) PES4800), Example 3-1 to Example 3-8 each had the maximum absorption wavelength $\lambda_{Pmax}$ positioned in the wavelength of 702 to 717 nm, the average transmittance of light with the wavelength of 430 to 480 nm of 87% or more, and $\lambda_{Pmax}-\lambda_{P80}$ of 114 nm or less. This indicates that the examples containing the squarylium-based dye of Formula (AI) can maintain the transmittance of light with the wavelength of 600 to 700 nm to be high, and further, the transmittance in the visible region with the wavelength of 430 to 480 nm is high, and the absorption curve in the vicinity of a boundary between the visible region and the near-infrared region is steep.

mass %, the solutions being prepared by dissolving a polyimide resin (C3450), a polyethersulfone resin (SUMIKAEXCEL (registered trademark) PES4800), and a polyester resin (OKP850), respectively, in a mixed solvent (cyclohexanone:NMP=1:1). Results are illustrated in Table 8 together with the kinds of the used dyes. Note that the temperature of the resin solution in the solubility test was set to 50° C., the NR dye was put into the resin solution, the resultant resin solution was stirred for two hours, and the presence/absence of occurrence of the dissolution was observed visually. Evaluation criteria of the solubility are as follows.

TABLE 7

| | Dye abbreviation | Resin | Film thickness [μm] | Amount of dye relative to 100 parts by mass of resin [part by mass] | $\lambda_{Pmax}$ [nm] | Minimum transmittance of 430 nm to 550 nm [%] | Absorption width [nm] | $\lambda_{P80}$ [nm] | $\lambda_{Pmax} - \lambda_{P80}$ [nm] | Average transmittance of 430 nm to 480 nm [%] |
|---|---|---|---|---|---|---|---|---|---|---|
| Example 4-1 | A1-2 | OKP850 | 1.0 | 8.87 | 702 | 78.9 | 30 | 597 | 105 | 89.4 |
| Example 4-2 | A1-3 | (polyester | 1.0 | 9.62 | 702 | 78.4 | 30 | 597 | 105 | 89.2 |
| Example 4-3 | A1-4 | resin) | 1.0 | 11.28 | 702 | 76.7 | 30 | 598 | 104 | 88.2 |
| Example 4-4 | A1-6 | | 0.9 | 8.15 | 708 | 79.4 | 30 | 614 | 94 | 89.7 |
| Example 4-5 | A1-7 | | 1.0 | 8.65 | 708 | 79.0 | 30 | 614 | 94 | 89.5 |
| Example 4-6 | A1-8 | | 1.0 | 8.15 | 708 | 79.4 | 30 | 614 | 94 | 89.3 |
| Example 4-7 | A1-10 | | 0.9 | 8.61 | 714 | 83.2 | 30 | 626 | 88 | 89.4 |
| Example 4-8 | A1-11 | | 0.9 | 8.98 | 714 | 81.4 | 30 | 626 | 88 | 89.4 |
| Example 4-9 | A1-12 | | 0.9 | 8.57 | 716 | 81.8 | 30 | 628 | 88 | 89.3 |
| Example 4-10 | A1-13 | | 0.9 | 9.38 | 716 | 80.9 | 30 | 628 | 88 | 88.5 |
| Example 4-11 | A2 | | — | — | — | — | — | — | — | — |

As illustrated in Table 7, among Examples using the polyester resin (OKP850), Example 4-1 to Example 4-10 each had the maximum absorption wavelength $\lambda_{Pmax}$ positioned in the wavelength of 702 to 716 nm, the average transmittance of light with the wavelength of 430 to 480 nm A: Solubility of 9 mass % or more B: Solubility of 7 mass % or more and less than 9 mass %

C: Solubility of 5 mass % or more and less than 7 mass %

D: Solubility of 3 mass % or more and less than 5 mass %

E: Solubility of 1 mass % or more and less than 3 mass %

F: Solubility of less than 1 mass %

TABLE 8

| Dye abbreviation | Evaluation* | | |
|---|---|---|---|
| | Polyimide resin | Polyethersulfone resin | Polyester resin |
| A1-1 | E | E | D |
| A1-2 | A | A | A |
| A1-3 | A | A | A |
| A1-4 | A | A | A |
| A1-5 | F | F | F |
| A1-6 | A | A | A |
| A1-7 | A | A | A |
| A1-8 | A | A | A |
| A1-9 | E | E | E |
| A1-10 | A | A | A |
| A1-11 | A | A | A |
| A1-12 | A | A | A |
| A1-13 | A | A | A |

*A: 9 mass % or more B: 7 mass % or more and less than 9 mass % C: 5 mass % or more and less than 7 mass % D: 3 mass % or more and less than 5 mass % E: 1 mass % or more and less than 3 mass % F: Less than 1 mass %

As illustrated in Table 8, the dyes (A1-2) to (A1-4), (A1-6) to (A1-8), and (A1-10) to (A1-13) in each of which the substituent $R^2$ has an alkyl structure with a carbon atom number of three or more, have a high solubility to the resin solution as compared to the other dyes having a methyl group (with carbon atom number of one) or a phenyl group. From the above, it is inferred that the alkyl structure with a carbon atom number of three or more of the substituent $R^2$ contributes to the improvement in the solubility, and meanwhile, the ring structure lowers the solubility. When the solution property to the resin solution is high, coatability improves, and a resin film having a thin thickness can be formed. Further, by forming a thin resin film, resin expansion during heat treatment can be suppressed, and it is possible to reduce an adverse effect with respect to the other members and the other functional layers which form the optical filter. Concretely, for example, it is possible to suppress damage or the like of the anti-reflection layer.

<Production of Optical Filter [I]>

To a solution prepared by dissolving a polyimide resin (C3450) in a mixed solvent (cyclohexanone+NMP), the above-described NIR absorbing dye (A1-2) was added and dissolved by a ratio to be 11 mass % relative to the mass of the polyimide resin, thereby preparing a coating liquid for forming an absorption layer.

This coating liquid was applied by a spin coating method onto a glass (AN100) substrate having a thickness of 0.3 mm, and then heated under atmospheric pressure, thereby forming an absorption layer having a thickness of about 1.0 μm.

Thereafter, a $TiO_2$ film and a $SiO_2$ film were alternately stacked on the surface of the absorption layer by a vapor deposition method to form an anti-reflection layer, thereby obtaining an optical filter.

Example 5-2 to Example 5-10

In each of Example 5-2 to Example 5-10, an optical filter was produced similarly to Example 5-1 except that the kind of the NIR absorbing dyes and/or the resin to be added to the coating liquid for forming the absorption layer was changed as illustrated in Table 9.

<Evaluation of Adhesiveness of Optical Filter [I]>

Regarding the fabricated optical filters, a cross cut tape peel test was conducted for 100 squares (10 mm×10 mm) under conditions of (1) to (3), the number of squares in which the peeling occurred among the 100 squares was counted, to thereby evaluate the adhesiveness (regarding Example 5-6 to Example 5-10, the evaluation was performed only under the conditions of (1) and (2)).

Condition (1): Peeling was performed with tape of 3.9 N/cm.

Condition (2): Peeling was performed with tape of 6.0 N/cm.

Condition (3): Optical filter was immersed in water at 30° C. for 10 minutes, and then peeling was performed with tape of 6.0 N/cm.

Results are collectively illustrated in Table 9. Evaluation criteria of the adhesiveness are as follows.

A: Number of squares was 0 (No peeling occurred.)
B: Number of squares was 1 to 9
C: Number of squares was 10 to 30
D: Number of squares was 31 to 50
E: Number of squares was 51 to 100

TABLE 9

| | Dye abbreviation | Resin | Adhesiveness* | | |
|---|---|---|---|---|---|
| | | | 3.9 N/cm | 6.0 N/cm | Immersed in water + 3.9 N/cm |
| Example 5-1 | A1-2 | Neopulim ® | A | A | A |
| Example 5-2 | A1-3 | C3450 | A | A | A |
| Example 5-3 | A1-6 | (polyimide resin) | A | A | A |
| Example 5-4 | A1-7 | | A | A | B |
| Example 5-5 | A3 | | A | A | C |
| Example 5-6 | A1-2 | SUMIKAEXCEL ® | A | A | — |
| Example 5-7 | A1-3 | PES4800 | A | A | — |
| Example 5-8 | A1-6 | (polyethersulfone | A | A | — |
| Example 5-9 | A1-7 | resin) | A | A | — |
| Example 5-10 | A3 | | B | E | — |

*A: Number of squares was 0 (No peeling occurred.) B: Number of squares was 1 to 9 C: Number of squares was 10 to 30 D: Number of squares was 31 to 50 E: Number of squares was 51 to 100

As is apparent from Table 9, each of the optical filters of Example 5-1 to Example 5-4, and Example 5-6 to Example 5-9 containing the squarylium-based dye of Formula (AI) exhibited good adhesiveness even in the case where the polyimide resin or the polyethersulfone resin known as a resin having low adhesiveness with respect to the glass or the dielectric multilayer film was used.

<Production of Optical Filter [II]>

Example 6-1

Figure 2:
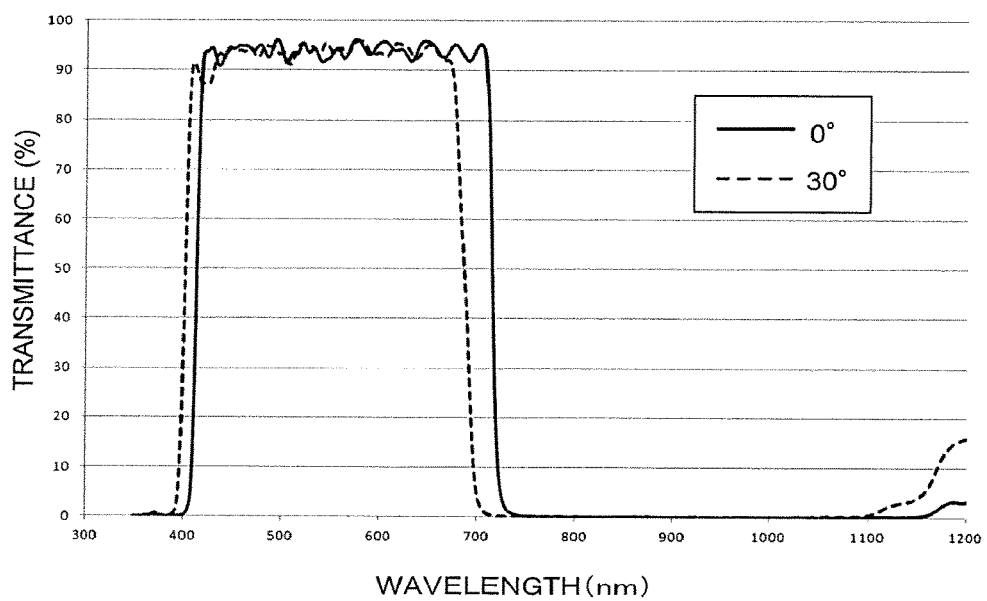
FIG. 2 is a diagram illustrating spectral transmittance curves of a selected wavelength blocking layer used in an optical filter of Example.

On a glass (AN100) substrate having a thickness of 0.3 mm, a TiO$_2$ film and a SiO$_2$ film were alternately stacked by a vapor deposition method, to thereby form a selected wavelength blocking layer constituted of 52 dielectric multilayer films. The constitution of the selected wavelength blocking layer was obtained by performing a simulation with the number of stacks of the dielectric multilayer films, a film thickness of the TiO$_2$ film, and a film thickness of the SiO$_2$ film being parameters, so that (iii-1) and (iii-2) are satisfied, concretely, in the present example, the transmittance of light of a wavelength range of 420 to 695 nm becomes 90% or more, and the transmittance of light with a wavelength of 704 nm (maximum wavelength at which the transmittance of light of a wavelength range of 650 to 800 nm of an absorption layer to be described later becomes 1%) to 1100 nm becomes 1% or less in respective spectral transmittance curves at incident angles of 0° and 30°. FIG. 2 illustrates spectral transmittance curves (incident angles of 0° and 30°) of a selected wavelength blocking layer fabricated based on the above design.

Further, to a solution prepared by dissolving a polyimide resin (C3450) in a mixed solvent (cyclohexanone+NMP), N-[2-[3-(trimethoxysilyl)propyl]amino]ethyl]urea as a silane coupling agent was added and dissolved by a ratio to be 3 mass % relative to the mass of the polyimide resin. Furthermore, to this resin solution, the obtained NIR absorbing dye (A1-6) and the UV dye (M-2) were added and dissolved by a ratio to be 10.9 mass % and a ratio to be 4.5 mass % relative to the mass of the polyimide resin respectively, thereby preparing a coating liquid for forming an absorption layer.

This coating liquid was applied by a spin coating method onto a surface opposite to a selected wavelength blocking layer formation surface of the above-described glass substrate on which the selected wavelength blocking layer was formed, and then heated under atmospheric pressure, thereby forming an absorption layer having a thickness of about 1.0 μm.

Thereafter, a TiO$_2$ film and a SiO$_2$ film were alternately stacked on the surface of the absorption layer by a vapor deposition method, similarly to the selected wavelength blocking layer, to form an anti-reflection layer, thereby obtaining an optical filter.

Note that the constitution of the anti-reflection layer was also determined by performing a simulation with the number of stacks of dielectric multilayer films, a film thickness of the TiO$_2$ film, and a film thickness of the SiO$_2$ film being parameters so as to have a predetermined optical characteristic.

Example 6-2

An optical filter was produced similarly to Example 6-1 except that a polyimide resin (C3630) was used in place of the polyimide resin (C3450), and the NIR dye (A1-6) was added by a ratio to be 12.8% relative to the mass of the polyimide resin.

Example 6-3

An optical filter was produced similarly to Example 6-1 except that the NIR dye (A3) was used in place of the NIR absorbing dye (A1-6), and the NIR dye (A3) was added by a ratio to be 10.1% relative to the mass of the polyimide resin.

Example 6-4

An optical filter was produced similarly to Example 6-3 except that a polyimide resin (C3630) was used in place of the polyimide resin (C3450), and the NIR dye (A3) was added by a ratio to be 8.8% relative to the mass of the polyimide resin.

<Evaluation of Spectral Characteristic of Optical Filter [II]>

Regarding the fabricated optical filters (Example 6-1 to Example 6-4), spectral transmittance curves (incident angles of 0° and 30°) were measured, and from measurement results thereof, each optical characteristic was calculated. Results are illustrated in Table 10. Note that in Table 10, the values of the average transmittance and the minimum transmittance are values calculated from the spectral transmittance curve at the incident angle of 0°.

Further, the transmittance average shift amount of the wavelength of 385 to 430 nm is a value as a result of averaging absolute values each being a difference between the transmittance of light with the wavelength of 385 to 430 nm of the spectral transmittance curve at the incident angle of 0° and the transmittance of light with the wavelength of 385 to 430 nm of the spectral transmittance curve at the incident angle of 30°.

In a similar manner, the transmittance average shift amount of the wavelength of 600 to 700 nm is a value as a result of averaging absolute values each being a difference between the transmittance of light with the wavelength of 600 to 700 nm of the spectral transmittance curve at the incident angle of 0° and the transmittance of light with the wavelength of 600 to 700 nm of the spectral transmittance curve at the incident angle of 30°.

TABLE 10

| | | Example 6-1 | Example 6-2 | Example 6-3 | Example 6-4 |
|---|---|---|---|---|---|
| Near-infrared absorbing dye A | Dye | A1-6 | A1-6 | A3 | A3 |
| | Amount of dye relative to 100 parts by mass of resin [part by mass] | 10.9 | 12.8 | 10.1 | 8.8 |
| Ultraviolet absorbing dye U | Dye | | | M-2 | |
| | Amount of dye relative to 100 parts by mass of resin [part by mass] | | | 4.5 | |
| Transparent resin | Resin | Neopulim ® C3450 | Neopulim ® C3630 | Neopulim ® C3450 | Neopulim ® C3630 |
| Absorption layer | Thickness [μm] | 1 | 1 | 1 | 1 |

TABLE 10-continued

|  |  | Example 6-1 | Example 6-2 | Example 6-3 | Example 6-4 |
|---|---|---|---|---|---|
| Optical characteristic | Average transmittance [%] (350-395 nm) | 0.06 | 0.06 | 0.07 | 0.06 |
|  | Average transmittance [%] (430-550 nm) | 91.7 | 91.4 | 92.4 | 93.2 |
|  | Average transmittance [%] (430-480 nm) | 86.0 | 85.1 | 87.1 | 88.4 |
|  | Average transmittance [%] (600-700 nm) | 32.8 | 27.7 | 43.6 | 45.9 |
|  | Average transmittance [%] (710-1100 nm) | 0.08 | 0.07 | 0.07 | 0.09 |
|  | Transmittance average shift amount [%/nm] (385-430 nm) | 4.93 | 5.46 | 5.51 | 6.27 |
|  | Transmittance average shift amount [%/nm] (600-700 nm) | 1.35 | 1.26 | 1.56 | 1.62 |
|  | Minimum transmittance [%] (430-550 nm) | 75.4 | 74.3 | 77.0 | 80.0 |

As is apparent from Table 10, each of the optical filters of Example 6-1 and Example 6-2 satisfied (iv-1) to (iv-6). Specifically, each of the above optical filters was an optical filter having high use efficiency of visible light and having low incident angle dependence of light in a long wavelength region of the visible region.

<Evaluation of Light Resistance of Optical Filter [II]>

A light resistance test was performed on the fabricated optical filters (Example 6-1 to Example 6-4) to evaluate light resistance.

In the light resistance test, a super xenon weather meter SX75 (product name, manufactured by Suga Test Instruments Co., Ltd.) was used to irradiate the optical filters with light under the following conditions.

Wavelength: 300 to 2450 nm
Temperature: 40° C.
Humidity: 50% RT
Integrated light amount: 87.2 kw·h/m$^2$ Before and after irradiation, a spectral transmittance curve (incident angle of 0°) was measured, the maximum transmittance of light of a wavelength range of 500 to 800 nm before and after irradiation was obtained, and a variation amount thereof was calculated by the following expression.

Maximum transmittance variation amount [%]= (maximum transmittance of light with wavelength of 500 to 800 nm before irradiation)− (maximum transmittance of light with wavelength of 500 to 800 nm after irradiation)

Results are illustrated in Table 11.

As is apparent from Table 11, each of the optical filters using the NIR dye (A1-6) according to the examples of the present invention exhibited excellent light resistance.

<Production of Optical Filter [III]>

Example 7-1

To a solution prepared by dissolving a polyimide resin (C3630) in a mixed solvent (cyclohexanone+NMP), the NIR absorbing dye (A1-6) and the UV dye (M-2) were added and dissolved by a ratio to be 4.3 mass % and a ratio to be 4.5 mass % relative to the mass of the polyimide resin respectively, thereby preparing a coating liquid for forming an absorption layer.

This coating liquid was applied by a spin coating method onto a near-infrared absorbing glass (NF-50TX) substrate having a thickness of 0.2 mm, and heated under atmospheric pressure, thereby forming an absorption layer having a thickness of about 0.9 μm.

Thereafter, a TiO$_2$ film and a SiO$_2$ film were alternately stacked on the surface of the absorption layer to form an anti-reflection layer, thereby obtaining an optical filter.

Example 7-2 and Example 7-3

In each of Example 7-2 and Example 7-3, an optical filter was produced similarly to Example 7-1 except that the kind of the NIR absorbing dyes and/or the resin each to be added

TABLE 11

|  |  | Example 6-1 | Example 6-2 | Example 6-3 | Example 6-4 |
|---|---|---|---|---|---|
| Near-infrared absorbing dye A | Dye | A1-6 | A1-6 | A3 | A3 |
|  | Amount of dye relative to 100 parts by mass of resin [part by mass] | 10.9 | 12.8 | 10.1 | 8.8 |
| Ultraviolet absorbing dye U | Dye |  |  | M-2 |  |
|  | Amount of dye relative to 100 parts by mass of resin [part by mass] |  |  | 4.5 |  |
| Transparent resin | Resin | Neopulim ® C3450 | Neopulim ® C3630 | Neopulim ® C3450 | Neopulim ® C3630 |
| Absorption layer | Thickness [μm] | 1 | 1 | 1 | 1 |
| Light resistance | Maximum transmittance variation amount [%] (500-800 nm) | 1.2 | 1.0 | 1.7 | 2.0 | to the coating liquid for forming the absorption layer was changed as illustrated in Table 12.

<Evaluation of Spectral Characteristic of Optical Filter [III]>

Regarding the fabricated optical filters (Example 7-1 to Example 7-3), spectral transmittance curves (incident angles of 0° and 30°) were measured, and from measurement results thereof, each optical characteristic was calculated. Results are illustrated in Table 12. Note that in Table 12, the definition of the values of the average transmittance and the minimum transmittance, and the transmittance average shift amount of the wavelength of 385 to 430 nm and the transmittance average shift amount of the wavelength of 600 to 700 nm, is similar to that in Table 10.

TABLE 12

| | | Example 7-1 | Example 7-2 | Example 7-3 |
|---|---|---|---|---|
| Near-infrared absorbing dye A | Dye | A1-6 | A1-10 | A1-12 |
| | Amount of dye relative to 100 parts by mass of resin [part by mass] | 4.26 | 6.93 | 7.23 |
| Ultraviolet absorbing dye U | Dye | | M-2 | |
| | Amount of dye relative to 100 parts by mass of resin [part by mass] | | 4.5 | |
| Transparent resin | Resin | | Neopulim ® C3630 | |
| Absorption layer | Thickness [μm] | | 0.9 | |
| Glass substrate | Glass | | NF-50TX | |
| Optical characteristic | Average transmittance [%] (350-395 nm) | 0.33 | 0.33 | 0.33 |
| | Average transmittance [%] (430-550 nm) | 92.0 | 90.7 | 90.6 |
| | Average transmittance [%] (430-480 nm) | 89.2 | 86.2 | 85.9 |
| | Average transmittance [%] (600-700 nm) | 31.9 | 30.7 | 31 |
| | Average transmittance [%] (710-1100 nm) | 0.0 | 0.0 | 0.0 |
| | Transmittance average shift amount [%/nm] (385-430 nm) | 1.25 | 1.13 | 1.19 |
| | Transmittance average shift amount [%/nm] (600-700 nm) | 1.30 | 0.80 | 0.70 |
| | Minimum transmittance [%] (430-550 nm) | 83.1 | 78.2 | 77.7 |

As is apparent from Table 12, each of the optical filters of Example 7-1 to Example 7-3 satisfied (iv-1) to (iv-6). Specifically, each of the above optical filters was an optical filter having high use efficiency of visible light and having low incident angle dependence of light in a long wavelength region, in particular, of the visible region.

Next, when the evaluation of adhesiveness similar to that of the optical filter [I] is performed on the optical filters [III], it can be confirmed that the result of determination [A] can be achieved with respect to each of the optical filters under the conditions (1) to (3) indicated in the optical filter [I].

Condition (1): Peeling was performed with tape of 3.9 N/cm.

Condition (2): Peeling was performed with tape of 6.0 N/cm.

Condition (3): Optical filter was immersed in water at 30° C. for 10 minutes, and then peeling was performed with tape of 6.0 N/cm.

The optical filter of the present invention is provided with an absorption layer having a good near-infrared blocking characteristic and having excellent adhesiveness with respect to a layer to be abutted, and thus it is useful for being applied to an imaging device such as a digital still camera, a display device such as a plasma display, and the like.

What is claimed is:

1. An optical filter, comprising:
an absorption layer comprising a near-infrared absorbing dye and a transparent resin; and
an inorganic or organic material in contact with the absorption layer,
wherein the near-infrared absorbing dye comprises a squarylium-based dye of the following formula (AI):

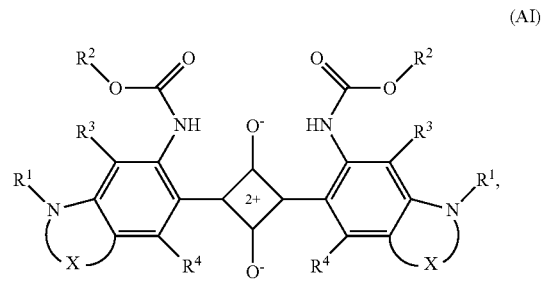

wherein
each X is independently a bivalent organic group of the following formula (1) or (2), wherein at least one hydrogen atom is optionally substituted with a $C_{1-12}$ alkyl or alkoxy group;

wherein n1 is 2 or 3;

wherein each of n2 and n3 is independently an integer of 0 to 2, and n2+n3 is 1 or 2;

each $R^1$ independently represents a saturated or unsaturated $C_{1-12}$ hydrocarbon group which optionally comprises a saturated ring structure or is optionally branched, a saturated $C_{3-12}$ cyclic hydrocarbon group, a $C_{6-12}$ aryl group, or a $C_{7-13}$ alaryl group;

each $R^2$ is independently a $C_{1-25}$ hydrocarbon group in which at least one hydrogen atom is optionally substituted with a halogen atom, a hydroxyl group, a carboxy group, a sulfo group, or a cyano group and that optionally comprises an unsaturated bond, an oxygen atom, or a saturated or unsaturated ring structure between carbon atoms; and $R^3$ and $R^4$ each independently represent a hydrogen atom, a halogen atom, or a $C_{1-10}$ alkyl or alkoxy group.

2. The optical filter according to claim 1, wherein X is a bivalent organic group of the following formula (3):

$$-CR^5{}_2-(CR^6{}_2)_{n4}- \quad (3)$$

wherein the left side is bonded to a benzene ring and the right side is bonded to N, n4 is 1 or 2, each $R^5$ is independently a $C_{1-12}$ alkyl or alkoxy group that may be branched, and each $R^6$ is independently a hydrogen atom, or a $C_{1-12}$ alkyl or alkoxy group that may be branched.

3. The optical filter according to claim 2, wherein each $R^5$ is independently a $C_{1-6}$ alkyl or alkoxy group that may be branched, and each $R^6$ is independently a hydrogen atom or a $C_{1-6}$ alkyl or alkoxy group that may be branched.

4. The optical filter according to claim 1, wherein X is a bivalent organic group having a formula selected from the group consisting of the following formulas (11-1) to (12-3):

$$-C(CH_3)_2-CH(CH_3)- \quad (11-1)$$

$$-C(CH_3)_2-CH_2- \quad (11-2),$$

$$-C(CH_3)_2-CH(C_2H_5)- \quad (11-3),$$

$$-C(CH_3)_2-CH_2-CH_2- \quad (12-1),$$

$$-C(CH_3)_2-CH_2-CH(CH_3)- \quad (12-2), \text{ and}$$

$$-C(CH_3)_2-CH(CH_3)-CH_2- \quad (12-3)$$

wherein the left side of each formula is bonded to a benzene ring and the right side of each formula is bonded to N.

5. The optical filter according to claim 1, wherein each $R^1$ is independently a group of the following formula (4-1) or (4-2);

wherein each of $R^7$, $R^8$, $R^9$, $R^{10}$, and $R^{11}$ independently represent a hydrogen atom, a halogen atom, or a $C_{1-4}$ alkyl group.

6. The optical filter according to claim 1, wherein each $R^2$ is independently a $C_{1-12}$ alkyl or alkoxy group that may be branched.

7. The optical filter according to claim 1, wherein the squarylium-based dye of the formula (A1) has an absorption characteristic, measured by dissolving in dichloromethane, satisfying the following (i-1) to (i-3):

(i-1) a maximum absorption wavelength $\lambda_{max}$ is in a wavelength range of from 670 to 730 nm, in an absorption spectrum of a wavelength range of from 400 to 800 nm, (i-2) the following relational expression is satisfied between a maximum absorption constant $\varepsilon_A$ of light of a wavelength range of from 430 to 550 nm and a maximum absorption constant $\varepsilon_B$ of light of a wavelength range of from 670 to 730 nm:

$\varepsilon_B/\varepsilon_A \geq 50$, and (i-3) a difference between a wavelength $\lambda_{80}$ at which a transmittance becomes 80% on a shorter wavelength side than the maximum absorption wavelength with a transmittance at the maximum absorption wavelength $\lambda_{max}$ set to 10% and the maximum absorption wavelength $\lambda_{max}$, is 60 nm or less, in a spectral transmittance curve.

8. The optical filter according to claim 1, wherein the near-infrared absorbing dye is dissolved or dispersed in a transparent resin comprising at least one selected from the group consisting of an acrylic resin, an epoxy resin, an ene-thiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide-imide resin, a polyolefin resin, a cyclic olefin resin, and a polyester resin.

9. The optical filter according to claim 1, wherein the absorption layer comprises a silane coupling agent having at least one group selected from the group consisting of a vinyl group, an epoxy group, a styryl group, a methacrylic group, an acrylic group, an amino group, an ureido group, a mercapto group, a sulfide group, and an isocyanate group.

10. The optical filter according to claim 1, wherein the absorption layer comprises an ultraviolet absorbing dye satisfying the following (ii-1):

(ii-1) a maximum absorption wavelength is in a wavelength region of from 360 to 415 nm, in an absorption spectrum of a wavelength of from 350 to 800 nm measured by dissolving in dichloromethane.

11. The optical filter according to claim 10, wherein the ultraviolet absorbing dye is a compound of the following formula (M):

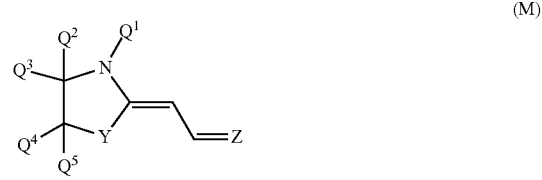

wherein

Y represents a methylene group or an oxygen atom substituted with $Q^6$ and $Q^7$ wherein each of $Q^6$ and $Q^7$ independently represents a hydrogen atom, a halogen atom, or a $C_{1-10}$ alkyl or alkoxy group;

$Q^1$ represents a monovalent $C_{1-12}$ hydrocarbon group that is optionally substituted;

each of $Q^2$ to $Q^5$ independently represents a hydrogen atom, a halogen atom, or a $C_{1-10}$ alkyl or alkoxy group; and Z represents a bivalent group of having a formula selected from the groups consisting of the following formulas (Z1) to (Z5):

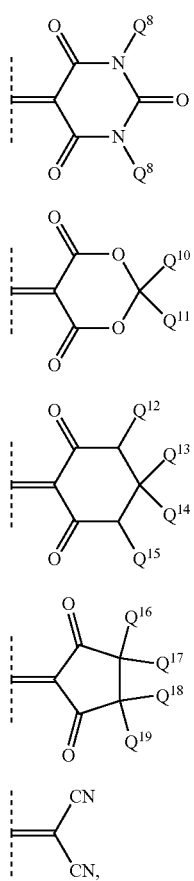

wherein each of $Q^8$ and $Q^9$ independently represents a monovalent $C_{1-12}$ hydrocarbon group that is optionally substituted, and each of $Q^{10}$ to $Q^{19}$ is independently a hydrogen atom or a monovalent $C_{1-12}$ hydrocarbon group that is optionally substituted.

12. The optical filter according to claim 1, wherein the absorption layer is in contact with a transparent substrate or a dielectric multilayer film.

13. The optical filter according to claim 12, wherein the transparent substrate comprises a glass.

14. The optical filter according to claim 13, wherein the glass is a near-infrared absorbing glass.

15. The optical filter according to claim 1, further comprising a selected wavelength blocking layer satisfying the following (iii-1) and (iii-2);
   (iii-1) a transmittance of light of a wavelength range of from 420 to 695 nm is 90% or more in spectral transmittance curves at incident angles of 0° and 30°, respectively, and
   (iii-2) a transmittance of light of a wavelength range of $\lambda_b$ nm to 1100 nm is 1% or less in spectral transmittance curves at incident angles of 0° and 30°, respectively, wherein $\lambda_b$ is a maximum wavelength at which a transmittance of light of a wavelength range of from 650 to 800 nm of the absorption layer becomes 1%.

16. The optical filter according to claim 1, having a spectral characteristic satisfying the following (iv-1);
   (iv-1) an average transmittance of light of a wavelength range of from 430 to 550 nm is 90% or more, and a minimum transmittance of light of a wavelength range of 4 from 30 to 550 nm is 75% or more in a spectral transmittance curve at an incident angle of 0°.

17. The optical filter according to claim 16, wherein the spectral characteristic further satisfies at least one of the following (iv-2) to (iv-6);
   (iv-2) an average transmittance of light of a wavelength range of from 600 to 700 nm is 25% or more in a spectral transmittance curve at an incident angle of 0°,
   (iv-3) an average transmittance of light of a wavelength range of from 350 to 395 nm is 2% or less in a spectral transmittance curve at an incident angle of 0°,
   (iv-4) an average transmittance of light of a wavelength range of from 710 to 1100 nm is 2% or less in a spectral transmittance curve at an incident angle of 0°,
   (iv-5) an average value of absolute values each being a difference between a transmittance of light of a wavelength range of from 385 to 430 nm in a spectral transmittance curve at an incident angle of 0° and a transmittance of light of a wavelength range of from 385 to 430 nm in a spectral transmittance curve at an incident angle of 30° is 7%/nm or less, and
   (iv-6) an average value of absolute values each being a difference between a transmittance of light of a wavelength range of from 600 to 700 nm in a spectral transmittance curve at an incident angle of 0° and a transmittance of light of a wavelength range of from 600 to 700 nm in a spectral transmittance curve at an incident angle of 30° is 7%/inn or less.

18. An imaging device, comprising:
   a solid-state image sensing element; and
   the optical filter according to claim 1.

* * * * *